United States Patent
Miyanishi et al.

(10) Patent No.: US 11,283,034 B2
(45) Date of Patent: Mar. 22, 2022

(54) HYBRID PARTICLE, PHOTOELECTRIC CONVERSION ELEMENT, PHOTOSENSITIVE BODY, AND IMAGE FORMING APPARATUS

(71) Applicant: SHARP KABUSHIKI KAISHA, Sakai (JP)

(72) Inventors: Shintaro Miyanishi, Sakai (JP); Hiroshi Sugimura, Sakai (JP); Tatsuhiro Morita, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 96 days.

(21) Appl. No.: 16/792,567

(22) Filed: Feb. 17, 2020

(65) Prior Publication Data

US 2020/0287149 A1   Sep. 10, 2020

(30) Foreign Application Priority Data

Mar. 4, 2019   (JP) .............................. JP2019-038600

(51) Int. Cl.
*H01L 27/146* (2006.01)
*H01L 51/42* (2006.01)

(52) U.S. Cl.
CPC .... *H01L 51/4266* (2013.01); *H01L 27/14634* (2013.01)

(58) Field of Classification Search
CPC ........... H01L 51/4266; H01L 27/14634; H01L 27/307; H01L 51/0078; H01L 51/4246; H01L 51/4226; H01L 27/14601; H01L 51/4253; H01L 51/0077; H01L 2251/303; H01L 2251/301; Y02E 10/549; G03G 15/0233

See application file for complete search history.

(56) References Cited

U.S. PATENT DOCUMENTS

| | | | |
|---|---|---|---|
| 9,306,092 B2 * | 4/2016 | Lee ..................... | H01L 31/0322 |
| 2005/0150541 A1 * | 7/2005 | Scher ..................... | H01L 31/04 136/250 |
| 2007/0175507 A1 * | 8/2007 | Dutta .................. | H01L 31/0392 136/255 |
| 2008/0066802 A1 * | 3/2008 | Reddy ................. | H01L 51/0049 136/258 |
| 2008/0110494 A1 * | 5/2008 | Reddy ................. | H01L 51/4213 136/255 |
| 2010/0032645 A1 * | 2/2010 | Choi .................... | C09K 11/883 257/13 |

(Continued)

FOREIGN PATENT DOCUMENTS

| | | |
|---|---|---|
| JP | 2004-261747 A | 9/2004 |
| JP | 2008-174677 A | 7/2008 |
| WO | 2017/104792 A1 | 6/2017 |

*Primary Examiner* — Bitew A Dinke
(74) *Attorney, Agent, or Firm* — ScienBiziP, P.C.

(57) ABSTRACT

A hybrid particle according to the present invention includes an inorganic core particle, an electron transport layer covering a surface of the inorganic core particle, and a light absorption layer covering the electron transport layer. The light absorption layer contains a compound having an organic-inorganic hybrid perovskite crystal structure or a metal complex. The compound or the metal complex is grown in a crystalline form on a surface of the electron transport layer.

7 Claims, 18 Drawing Sheets

(56) References Cited

U.S. PATENT DOCUMENTS

| | | | |
|---|---|---|---|
| 2010/0294355 A1* | 11/2010 | Choi | H01L 31/035281 136/256 |
| 2013/0065354 A1* | 3/2013 | Seok | H01L 51/4226 438/82 |
| 2013/0092221 A1* | 4/2013 | De Moura Dias Mendes | H01L 31/03921 136/255 |
| 2013/0269762 A1* | 10/2013 | Cui | H01L 31/035227 136/255 |
| 2015/0185627 A1* | 7/2015 | Black | G03G 5/0696 430/132 |
| 2016/0172513 A1* | 6/2016 | Williams | H01L 27/14601 438/63 |
| 2016/0233449 A1* | 8/2016 | Murayama | C09K 11/883 |
| 2017/0149005 A1* | 5/2017 | Suzuka | H01L 51/448 |
| 2017/0346024 A1* | 11/2017 | Lee | H01L 51/0077 |
| 2017/0358399 A1* | 12/2017 | Matsuyama | H01L 51/0032 |
| 2018/0019371 A1* | 1/2018 | Steckel | H01L 27/156 |
| 2018/0197688 A1* | 7/2018 | Horiuchi | H01L 51/0053 |
| 2018/0330890 A1* | 11/2018 | Tanaka | H01G 9/2018 |
| 2018/0348577 A1* | 12/2018 | Pousthomis | H01L 27/322 |
| 2018/0366657 A1 | 12/2018 | Wakamiya et al. | |
| 2019/0198261 A1* | 6/2019 | Choi | H01G 11/46 |
| 2020/0328366 A1* | 10/2020 | Layton | H01L 31/03845 |

\* cited by examiner

HYBRID PARTICLE, PHOTOELECTRIC CONVERSION ELEMENT, PHOTOSENSITIVE BODY, AND IMAGE FORMING APPARATUS

BACKGROUND OF THE INVENTION

Field of the Invention

The present invention relates to a hybrid particle, a photoelectric conversion element, a photosensitive body, and an image forming apparatus.

Description of the Background Art

Photoelectric conversion elements are used in various optical sensors, solar cells, and the like. In particular, aspects such as the high photoelectric conversion efficiency and manufacturing costs have led to the widespread development of photoelectric conversion elements, in which a charge generation layer (light absorption layer) and a charge transfer layer are stacked. Furthermore, in recent years, a solar cell that uses a charge generation layer containing a compound having an organic-inorganic perovskite crystal structure has attracted attention due to its photoelectric conversion efficiency, which is comparable to that of an inorganic material (for example, see WO 2017/104792 A1). Moreover, in this solar cell, the photoelectric conversion efficiency is improved by forming a charge generation layer on the surface of mesoporous $TiO_2$. Mesoporous $TiO_2$ serves as a scaffold for the charge generation layer, and also functions as an electron transport layer.

Furthermore, a photosensitive body of an image forming apparatus that forms an electrostatic latent image is known which, in a similar manner to a photoelectric conversion element, has a structure in which a charge generation layer and a charge transfer layer are stacked. Further, it is known that a metal complex such as titanyl phthalocyanine has high-sensitivity characteristics as a charge generating material when included in a charge generation layer (for example, see Japanese Unexamined Patent Application Publication No. 2008-174677).

Such charge generation layers can be manufactured by a coating process without using a vacuum process. Therefore, manufacturing costs can be significantly reduced, and their application is anticipated in various fields as light conversion elements or photosensitive bodies that are promising in terms of aspects such as conversion efficiency and cost.

In solar cells using a charge generation layer containing a compound having an organic-inorganic perovskite crystal structure, the mesoporous $TiO_2$ that functions as the electron transport layer is a semiconductor with a relatively high electrical resistance. As a result, photoexcited carriers easily recombine, and the original photoelectric conversion efficiency cannot be realized.

Furthermore, the interface between the charge generation layer and the mesoporous $TiO_2$ is not controlled, and the existence of bond defects, voids, and the like, at the interface become recombination centers for the photoexcited carriers. Therefore, the photoexcitation carriers cannot be effectively extracted from the charge generation layer.

The present invention has been made in view of such circumstances, and has an object of providing a hybrid particle capable of suppressing recombination of photoexcited carriers generated in a light absorption layer.

SUMMARY OF THE INVENTION

The present invention provides a hybrid particle including an inorganic core particle, an electron transport layer covering a surface of the inorganic core particle, and a light absorption layer covering the electron transport layer, wherein the light absorption layer contains a compound having an organic-inorganic hybrid perovskite crystal structure or a metal complex, and the compound or the metal complex is grown in a crystalline form on a surface of the electron transport layer.

The light absorption layer included in the hybrid particle of the present invention contains a compound having an organic-inorganic hybrid perovskite crystal structure or a metal complex, and the compound or the metal complex is grown in a crystalline form on a surface of the electron transport layer. Therefore, bond defects and voids at the interface between the electron transport layer and the light absorption layer can be reduced. Consequently, photoexcited electrons from the light absorption layer can rapidly migrate to the electron transport layer. Furthermore, holes generated in the light absorption layer due to photoexcitation are drawn out from the surface of the hybrid particle to the outside. Therefore, the photoexcited carriers can be quickly separated into electrons and holes, and recombination of the photoexcited carriers can be suppressed.

DESCRIPTION OF THE PREFERRED EMBODIMENTS

Figure 1:
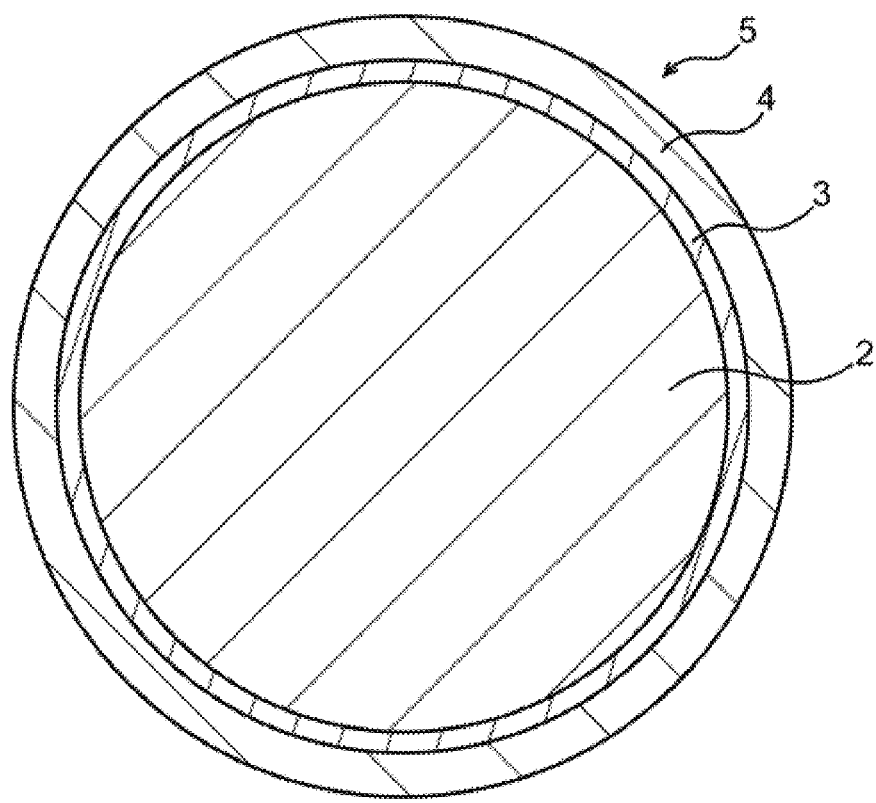
FIG. 1 is a schematic cross-sectional view of a hybrid particle according to an embodiment of the present invention.

A hybrid particle according to the present invention includes an inorganic core particle, an electron transport layer covering a surface of the inorganic core particle, and a light absorption layer covering the electron transport layer. The light absorption layer contains a compound having an organic-inorganic hybrid perovskite crystal structure or a metal complex. The compound or the metal complex is grown in a crystalline form on a surface of the electron transport layer.

The inorganic core particle included in the hybrid particle of the present invention is preferably a titanium oxide particle, and the electron transport layer is preferably a titanium nitride layer. As a result, the interface between the inorganic core particle and the electron transport layer can be made a favorable interface having few defects. Further, the probability of electrons flowing through the electron transport layer becoming trapped by interfacial defects can be reduced. Consequently, electrons can be extracted with a high efficiency. The electron band structure of the inorganic core particle, the electron transport layer, and the light absorption layer enables the photoexcited electrons to more easily migrate from the light absorption layer to the electron transport layer. Further, the crystal lattice constant of the titanium nitride layer (electron transport layer) is well-matched with the lattice constant of the compound including the organic-inorganic hybrid perovskite crystal structure, the metal complex, or the like. Therefore, a high-quality crystal growth and crystallization interface can be obtained, which enables the effect of suppressing recombination of photoexcited carrier at the interface to be obtained.

The organic-inorganic hybrid perovskite crystal structure preferably has a crystal structure represented by a general formula: $ABX_3$ (where A represents an organic cation, B represents a metal ion, and X represents a halogen ion). Furthermore, the compound having the organic-inorganic hybrid perovskite crystal structure is preferably a compound represented a general formula: $CH_3NH_3PbX_3$ (where X represents a halogen ion). Moreover, the metal complex is preferably titanyl phthalocyanine.

The present invention provides a photoelectric conversion element including a first electrode, a first charge separation layer provided on the first electrode, and a second electrode provided on the first charge separation layer, wherein the first charge separation layer includes a first hole transport layer and a plurality of hybrid particles of the present invention, and the plurality of hybrid particles are covered by the first hole transport layer.

When the photoelectric conversion element of the present invention is irradiated with light, the light absorption layer of the hybrid particle absorbs the light, and electrons are photoexcited to generate holes. The photoexcited electrons are conducted through the electron transport layer of the hybrid particle, and flow to the first electrode. The holes generated in the light absorption layer flow to the second electrode via the hole transport layer. Therefore, the photoexcited carriers can be spatially separated, and recombination of the photoexcited carriers can be suppressed. Furthermore, in the hybrid particle included in the photoelectric conversion element of the present invention, because there are few of bonding defects and voids at the interface, recombination of the photoexcited carriers can be suppressed. In addition, in the photoelectric conversion element of the present invention, because the light absorption layer is provided on the surface of the hybrid particle, the light absorption layer has an uneven shape. For this reason, it is possible to suppress reflection of the light that has entered the photoelectric conversion element. The recombination suppression effect and the reflection suppression effect can improve the photoelectric conversion efficiency of the photoelectric conversion element.

The present invention also provides a photosensitive body including a third electrode, and a second charge separation layer provided on the third electrode, wherein the second charge separation layer includes a second hole transport layer and a plurality of hybrid particles according the present invention, and the plurality of hybrid particles are covered by the second hole transport layer. The photosensitive body of the present invention contains the hybrid particle of the present invention, which is capable of suppressing recombination of electrons and holes. Therefore, it is possible to improve the image quality of an image forming apparatus.

The present invention also provides an image forming apparatus including the photosensitive body of the present invention.

Hereinafter, the present invention will be described in more detail with reference to a plurality of embodiments. The configurations illustrated in the drawings and in the following description are examples. The scope of the present invention is not limited to that illustrated in the drawings and in the following description.

First Embodiment

FIG. 1 is a schematic cross-sectional view of a hybrid particle according to the present embodiment.

A hybrid particle 5 according to the present embodiment includes an inorganic core particle 2, an electron transport layer 3 covering a surface of the inorganic core particle 2, and a light absorption layer 4 covering the electron transport layer 3. The light absorption layer 4 contains a compound having an organic-inorganic hybrid perovskite crystal structure or a metal complex. The compound or the metal complex is grown in a crystalline form on a surface of the electron transport layer 3.

The hybrid particle 5 is a particle in which different materials are combined. The particle size of the hybrid particle 5 is, for example, 10 nm or more and 100 μm or less, and preferably 50 nm or more and 10 μm or less.

The inorganic core particle 2 is a particle made of an inorganic material, and is a particle serving as a base material of the hybrid particle 5. The particle size of the inorganic core particle 2 is, for example, 10 nm or more and 100 μm or less, and preferably 50 nm or more and 10 μm or less. The inorganic core particle 2 is, for example, a titanium oxide particle ($TiO_2$ particle). The titanium oxide particle may be a rutile type or anatase type particle. The particle size of the titanium oxide particle can be, for example, 100 nm to 200 nm.

The electron transport layer 3 is a layer that covers the surface of the inorganic core particle 2, and is a layer that transports photoexcited electrons from the light absorption layer 4. The electron transport layer 3 is preferably a conductor layer. Furthermore, the electric resistivity of the material of the electron transport layer 3 is preferably $10^{-3}$ Ωcm or less. Moreover, the material of the electron transport layer 3 may be a metal, or may be a metallically bonded substance such as TiN (NaCl structure), TiB2, or TiC.

As a result, photoexcited electrons from the light absorption layer 4 can be quickly transported, and recombination of the photoexcited electrons and holes can be suppressed. The film thickness of the electron transport layer 3 can be, for example, 5 nm or more and 1 μm or less. In addition, the material of the electron transport layer 3 preferably has a NaCl-type crystal structure.

The inorganic core particle 2 is preferably a titanium oxide particle. The electron transport layer 3 is preferably a titanium nitride layer (TiN layer or $TiN_x$ layer, where $0.8 < x < 1.16$). For example, a titanium nitride layer (film thickness: 5 to 30 nm) can be formed on the surface of a titanium oxide particle by subjecting a titanium oxide powder (inorganic core particle 2) to a surface modification treatment using nitrogen plasma. Examples of the method of forming a titanium nitride layer include the method described in Japanese Unexamined Patent Application Publication No. 2004-261747. The lattice constant of $TiO_2$ (rutile structure) and TiN (NaCl structure, lattice constant a: about 0.424 nm) are relatively compatible. Therefore, a favorable interface with few defects can be obtained between the inorganic core particle 2 composed of $TiO_2$ and the electron transport layer 3 composed of TiN. As a result of forming a mixed crystal substance $TiO_{2-x}N_x$ near the interface, the lattice constant changes continuously and the generation of interfacial defects can be suppressed. Furthermore, the bonding between the surface of the inorganic core particle 2 and the electron transport layer 3 can be improved. Therefore, the structural stability of the hybrid particle 5 can be improved.

The light absorption layer 4 is a layer that absorbs light and generates photoexcited carriers (electrons and holes). Moreover, the light absorption layer 4 is provided so as to cover the electron transport layer 3 and make contact with the electron transport layer 3. For this reason, the electrons generated in the light absorption layer 4 can migrate to the electron transport layer 3, and the electrons and holes generated in the light absorption layer 4 can be separated. The film thickness of the light absorption layer 4 can be, for example, 20 nm or more and 1 μm or less.

The light absorption layer 4 contains a compound having an organic-inorganic hybrid perovskite crystal structure (hereinafter, also referred to as a perovskite structure compound). The light absorption layer 4 may include a perovskite structure compound having a band gap of 1.1 eV or more and 1.7 eV or less.

The organic-inorganic hybrid perovskite crystal structure has a crystal structure represented by a general formula: $ABX_3$ (where A represents an organic cation, B represents a metal ion, and X represents a halogen ion). The perovskite structure compound preferably has a cubic or tetragonal perovskite crystal structure.

The perovskite structure compound that can be used for the light absorption layer 4 has a tetragonal primitive unit cell. The unit cell includes organic cations (organic molecule) A disposed at each vertex, a metal ion B disposed at the body center, and halogen ions X disposed at each face center, and is represented by the general formula $ABX_3$.

In the general formula $ABX_3$, specific examples of the organic cation A (organic molecular alkylamine) include methylamine, ethylamine, propylamine, butylamine, pentylamine, hexylamine, dimethylamine, diethylamine, dipropylamine, dibutylamine, dipentylamine, dihexylamine, trimethylamine, triethylamine, tripropylamine, tributylamine, tripentylamine, trihexylamine, ethylmethylamine, methylpropylamine, butylmethylamine, methylpentylamine, hexylmethylamine, ethylpropylamine, ethylbutylamine, imidazole, azole, pyrrole, aziridine, azirine, azetidine, azeto, azole, imidazoline, carbazole, ions of these alkylamines (such as methylammonium ($CH_3NH_3$)), and phenethylammonium. These organic cations may be used alone or in combination of two or more.

Among these, preferable as the organic cation A are methylamine, ethylamine, propylamine, butylamine, pentylamine, hexylamine, ions of these alkylamines, and phenethylammonium. Particularly preferable are methylamine, ethylamine, propylamine, and ions of these alkylamines (such as methylammonium ($CH_3NH_3$)).

In the general formula $ABX_3$, specific examples of the metal ion B include lead, tin, zinc, titanium, antimony, bismuth, nickel, iron, cobalt, silver, copper, gallium, germanium, magnesium, calcium, indium, aluminum, manganese, chromium, molybdenum, and europium. These elements may be used alone or in combination of two or more. Among these, when the metal ion B is lead, the characteristics of the light absorption layer 4 become more favorable.

In the general formula $ABX_3$, specific examples of the halogen ion X include chlorine, bromine and iodine.

These elements may be used alone or in combination of two or more. Among these, it is preferable for at least one of the halogen ions X to be iodine because the energy band gap becomes narrower.

In the hybrid particle 5 according to the present embodiment, the perovskite structure compound is preferably a compound represented by $CH_3NH_3PbX_3$ (where X is a halogen ion), and more preferably a compound in which, in the formula $CH_3NH_3PbX_3$, X is an iodine atom (that is to say, a compound represented by $CH_3NH_3PbI_3$ (lattice constant a: 0.424 nm)).

Consequently, electrons and holes can be generated with higher efficiency in the light absorption layer 4. As a result, it is possible to obtain a photoelectric conversion element and a photosensitive body having a higher photoelectric conversion efficiency.

The light absorption layer 4 is provided such that the perovskite structure compound is grown in a crystalline form on the surface of the electron transport layer 3. The light absorption layer 4 is formed by epitaxially growing a perovskite structure compound on the surface of the electron transport layer 3 (heteroepitaxy). That is to say, the electron transport layer 3 and the light absorption layer 4 need to have a crystal lattice relationship such that the perovskite structure compound epitaxially grows on the surface of the electron transport layer 3.

As a result of the crystal growth of the perovskite structure compound on the surface of the electron transport layer 3, bonding defects and voids at the interface between the electron transport layer 3 and the light absorption layer 4 can be reduced. Consequently, photoexcited electrons from the light absorption layer 4 can rapidly migrate to the electron transport layer 3. As a result, the photoexcited carriers can be quickly separated into electrons and holes, and recombination of the photoexcited carriers can be suppressed.

Figure 2:
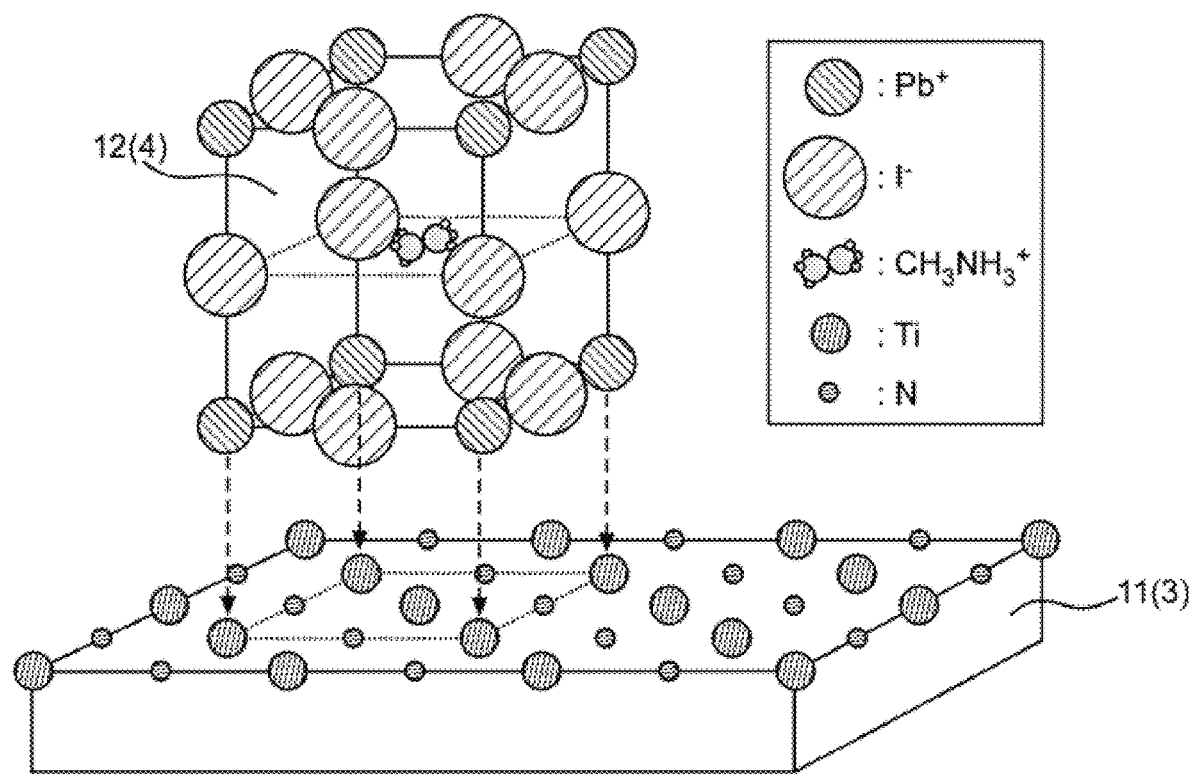
FIG. 2 is an explanatory view of crystal growth of $CH_3NH_3PbI_3$ (light absorption layer) on the surface of a TiN layer (electron transport layer).

FIG. 2 is an explanatory view of crystal growth of $CH_3NH_3PbI_3$ (light absorption layer 4) on the surface of a TiN layer 11 (electron transport layer 3). Furthermore, Table 1 illustrates the lattice constant and the like of various materials.

TiN has a NaCl-type crystal structure and $CH_3NH_3PbI_3$ has a tetragonal perovskite crystal structure. Therefore, TiN and $CH_3NH_3PbI_3$ have the same four-fold symmetric crystal structure. Furthermore, the lattice constant a of the tetragonal crystal of $CH_3NH_3PbI_3$ is 0.88 nm and the lattice constant a of TiN is 0.424 nm. Therefore, the lattice constant a of the tetragonal crystal of $CH_3NH_3PbI_3$ corresponds to about twice the lattice constant a of TiN, and the crystal lattice mismatch can be suppressed to about 7%. Consequently, TiN and $CH_3NH_3PbI_3$ have a crystal lattice relationship such that $CH_3NH_3PbI_3$ (perovskite structure compound, light absorption layer 4) epitaxially grows on the surface of the TiN layer 11 (electron transport layer 3).

Therefore, a favorable interface with few defects can be formed between the electron transport layer 3 and the light absorption layer 4. For example, $CH_3NH_3PbI_3$ is grown in a crystalline form on the surface of the TiN layer 11 with the orientation as illustrated in FIG. 2.

Specifically, the perovskite structure compound can be synthesized by mixing an AX solution and a $BX_2$ solution, and then heating and stirring the mixture (one-step method). Furthermore, the perovskite structure compound can be synthesized by applying a $BX_2$ solution to, for example, a $TiO_2$ particle (inorganic core particle 2) coated with a TiN layer 11 (electron transport layer 3) to form a coating film on the electron transport layer 3, applying an AX solution to the coating film, and reacting $BX_2$ with AX (two-step method). Both the one-step method and the two-step method can be used for forming the light absorption layer 4. The coating method is not particularly limited, and examples include a screen printing method and a dip coating method. As a result of using such a method, a light absorption layer 4 having a film thickness of 100 nm to 200 nm can be formed on the electron transport layer 3.

TABLE 1

|  | $TiO_2$ (rutile structure) | TiN (NaCl structure) | Perovskite $CH_3NH_3PbI_3$ (tetragonal) | Perovskite $CH_3NH_3PbI_3$ (orthorhombic) | TiOPc (Phase II) | TiOPc (Y-type) |
|---|---|---|---|---|---|---|
| Lattice constant | a = 0.459 nm c = 0.296 nm | a = 0.423- 0.425 nm | a = 0.88 nm c = 1.27 nm | a = 0.88 nm b = 1.26 nm c = 0.86 nm | a = 1.22 nm b = 1.26 nm c = 0.86 nm | a = 1.35 nm b = 1.59 nm c = 1.51 nm |
| Film thickness | — | 5-30 nm | 100-200 nm | 100-200 nm | 100-200 nm | 100-200 nm |
| Particle size d | 100-200 nm | 110-260 nm ($TiO_2$ + TiN) | 300-600 nm ($TiO_2$ + TiN + light absorption layer) | 300-600 nm ($TiO_2$ + TiN + light absorption layer) | 300-600 nm ($TiO_2$ + TiN + light absorption layer) | 300-600 nm ($TiO_2$ + TiN + light absorption layer) |

Figure 3:
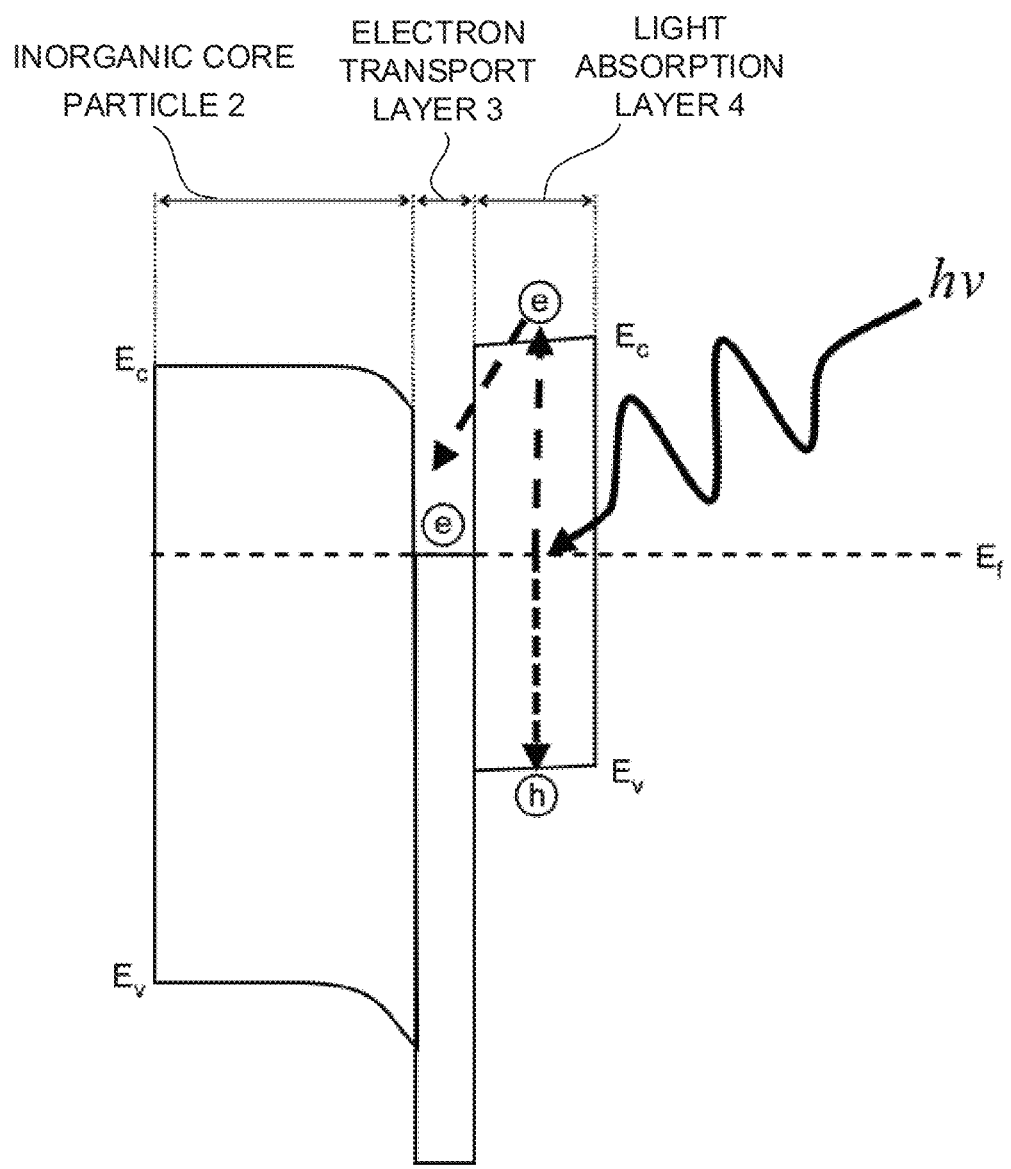
FIG. 3 is an energy band diagram of a hybrid particle according to an embodiment of the present invention.

FIG. 3 is an energy band diagram of the hybrid particle 5 according to the present embodiment. Table 2 illustrates the work function, the band gap $E_g$, the conduction band energy level $E_c$, the valence band energy level $E_v$ and the like of various materials.

There are few defects at the interface between the $TiO_2$ particle (inorganic core particle 2) and the TiN layer 11 (electron transport layer 3) and at the interface between the TiN layer 11 (electron transport layer 3) and $CH_3NH_3PbI_3$ (light absorption layer 4). Therefore, the probability of the electrons and holes generated when light enters the light absorption layer 4 becoming trapped at interfacial defects is reduced, and the electrons and holes can be extracted with high efficiency. Furthermore, as illustrated in FIG. 3, the electron transport layer 3 sandwiched between the inorganic core particle 2 and the light absorption layer 4 has an electron quantum well structure, and has a structure in which the electrons generated in the light absorption layer 4 are accumulated in the electron transport layer 3.

When the inorganic core particle 2 is a $TiO_2$ particle having a particle size of 100 nm to 200 nm, the electron transport layer 3 is a TiN layer 11 having a film thickness of 5 nm to 30 nm, and the light absorption layer 4 is a perovskite structure compound layer having a film thickness of 100 nm to 200 nm, the particle size of the hybrid particle 5 becomes 300 nm to 600 nm.

Second Embodiment

In the hybrid particle 5 according to the first embodiment, the light absorption layer 4 contains a perovskite structure compound. However, in the hybrid particle 5 of the second embodiment, the light absorption layer 4 contains a metal complex as a dye instead of the perovskite structure compound. Other configurations are the same as those of the first embodiment.

A metal complex includes a metal or metal ion located at the center of the molecule, and ligands surrounding the

TABLE 2

|  | Al (first electrode) | $TiO_2$ (inorganic core particle) | TiN (electron transport layer) | $CH_3NH_3PbI_3$ (light absorption layer) | TiOPc Y-type (light absorption layer) | Hole transport layer | Ag (second electrode) | TCO (second electrode) |
|---|---|---|---|---|---|---|---|---|
| Work function [eV] | −4.6 | — | −4.6 | — | — | — | −4.3 | −4.7 |
| Eg [eV] | — | 3 | — | 1.5 | 1.6-1.8 | 3.0 | — | — |
| Ec or LUMO [eV] | — | −4.0 | — | −3.9 | −3.9 | −2.0 | — | — |
| Ex or HOMO [eV] | — | −7.0 | — | −5.4 | −5.7 | −5.0 | — | — |

The perovskite structure compound, which can be used as the light absorption layer 4, can be synthesized by using as raw materials a compound represented by AX (where A represents an organic cation and X represents a halogen ion) and a compound represented by $BX_2$ (where B represents a metal ion and X represents a halogen ion).

metal or metal ion. A metal complex has highest occupied orbital HOMO and lowest unoccupied orbital LUMO. In a metal complex, light having an energy greater than the energy gap between HOMO and LUMO (the difference between the energy level of the HOMO and the energy level of the LUMO) is absorbed. As a result, an electron moves (transitions) from an orbital containing electrons to an empty orbital, which generates photoexcited carriers (an electron and a hole). The photoexcited electrons migrate to the electron transport layer 3. Consequently, the electrons and holes generated by the absorption of light by the metal complex can be separated, and recombination of the electrons and holes can be suppressed.

The light absorption layer 4 can include a metal complex having an energy gap between the HOMO and the LUMO of 1.1 eV or more and 2.0 eV or less. The metal complex included in the light absorption layer 4 is, for example, titanyl phthalocyanine (TiOPc).

The light absorption layer 4 is provided such that the metal complex is grown in a crystalline form on the surface of the electron transport layer 3. The light absorption layer 4 is formed by epitaxially growing the metal complex on the surface of the electron transport layer 3 (heteroepitaxy). That is to say, the electron transport layer 3 and the light absorption layer 4 have a crystal lattice relationship such that the metal complex epitaxially grows on the surface of the electron transport layer 3.

As a result of the crystal growth of the metal complex on the surface of the electron transport layer 3, bonding defects and voids at the interface between the electron transport layer 3 and the light absorption layer 4 can be reduced. Consequently, photoexcited electrons from the light absorption layer 4 can rapidly migrate to the electron transport layer 3. As a result, the photoexcited carriers can be quickly separated into electrons and holes, and recombination of the photoexcited carriers can be suppressed.

When the metal complex included in the light absorption layer 4 is titanyl phthalocyanine, a titanyl phthalocyanine crystal is formed as the light absorption layer 4 on the surface of the electron transport layer 3. A titanyl phthalocyanine crystal can be formed on the electron transport layer 3 with a film thickness of 100 to 200 nm. In this case, the particle size of the hybrid particle 5 becomes 300 to 600 nm (see Table 1).

Figure 4:
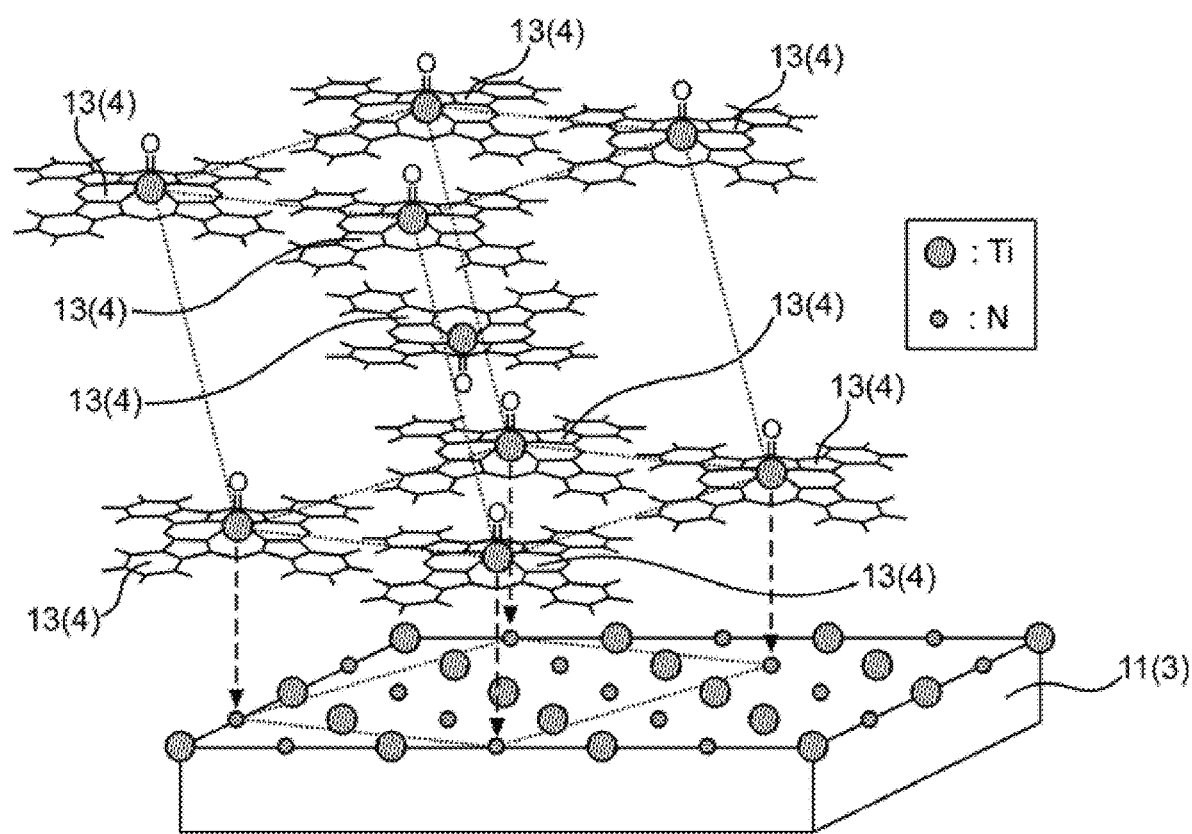
FIG. 4 is an explanatory diagram of crystal growth of titanyl phthalocyanine (light absorption layer) on the surface of a TiN layer (electron transport layer).
Figure 5:
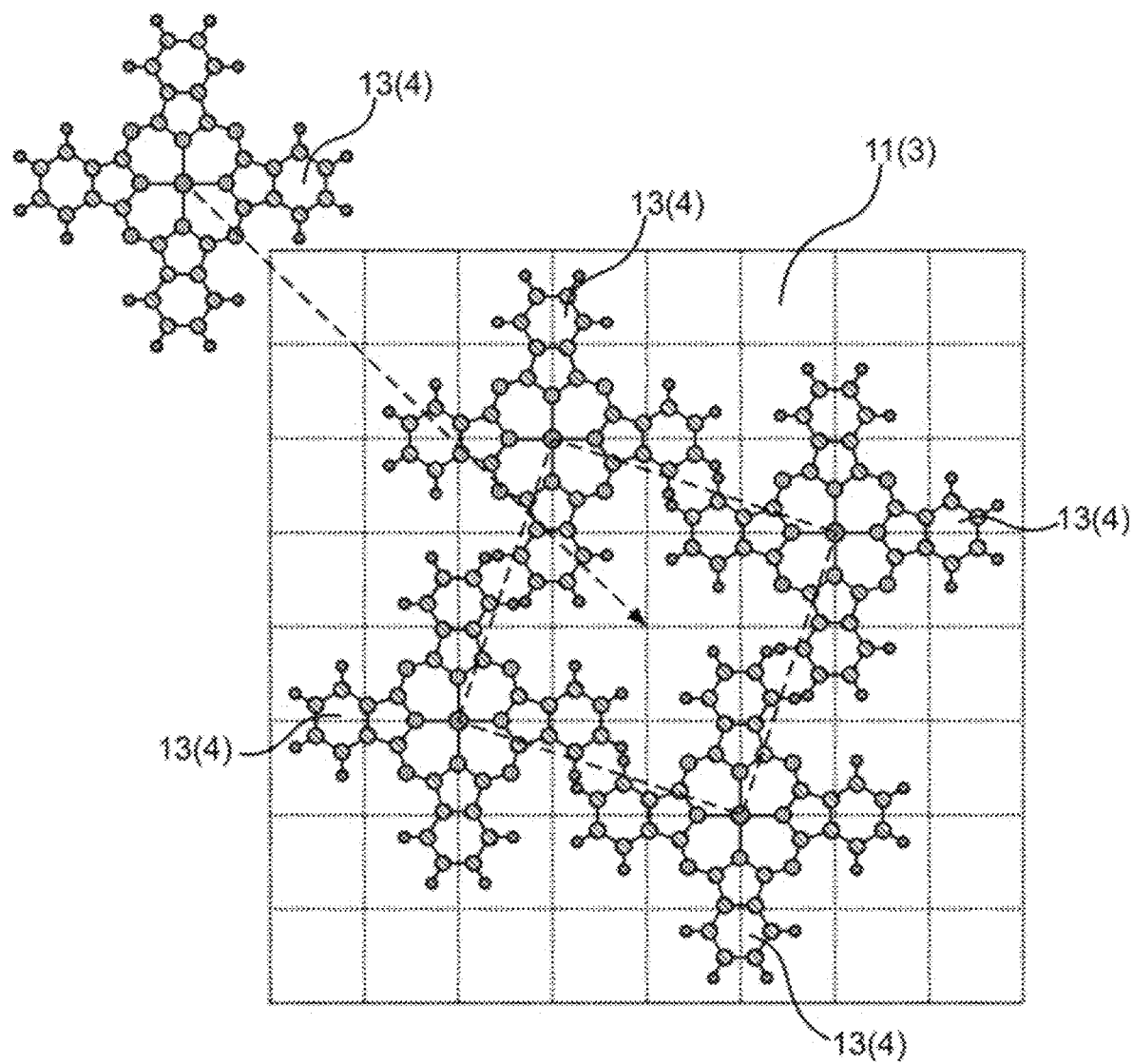
FIG. 5 is an explanatory diagram of crystal growth of titanyl phthalocyanine (light absorption layer) on the surface of a TiN layer (electron transport layer).
Figure 6:
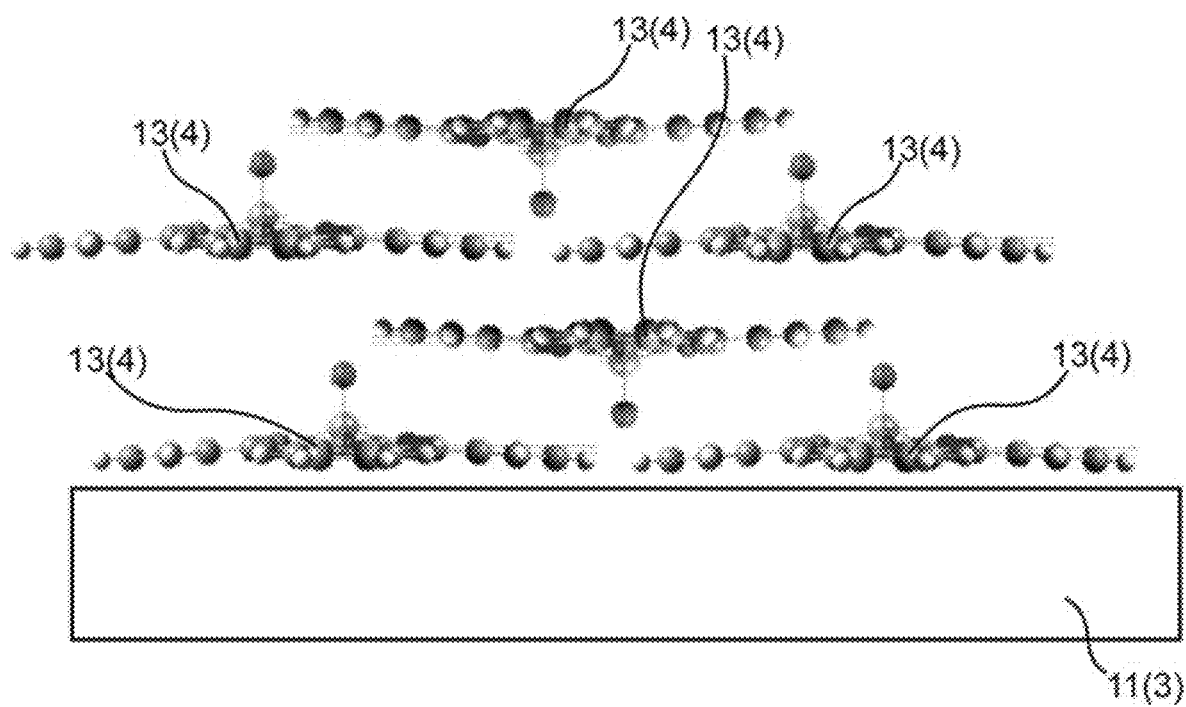
FIG. 6 is an explanatory diagram of crystal growth of titanyl phthalocyanine (light absorption layer) on the surface of a TiN layer (electron transport layer).

FIGS. 4, 5, and 6 represent schematic diagrams illustrating the crystal growth orientation of a Y-type titanyl phthalocyanine crystal on the surface of a TiN layer 11 serving as the electron transport layer 3. As the primitive unit cell of the Y-type titanyl phthalocyanine crystal on the TiN layer 11 in FIG. 4 illustrates, the Y-type titanyl phthalocyanine crystal serving as the light absorption layer 4 has an approximately tetragonal primitive unit cell (see Table 1). The face on the bottom surface of the approximately tetragonal crystal (a=1.35 nm, b=1.39 nm) corresponds to $\sqrt{5}$ times the lattice constant of the TiN serving as the electron transport layer 3. Because the lattice mismatch of 1 to 4% provides lattice matching, titanyl phthalocyanine can grow in a crystalline form on the TiN surface, and the formation of defects at the interface between the TiN layer 11 and the Y-type titanyl phthalocyanine crystal can be suppressed.

FIG. 5 illustrates the crystal growth orientation of the Y-type titanyl phthalocyanine crystal from directly above the surface of the TiN layer 11. FIG. 6 illustrates the crystal orientation of the TiN layer 11 and the Y-type titanyl phthalocyanine crystal when viewed from the side.

Examples of the method of forming the titanyl phthalocyanine crystal, which serves as the light absorption layer 4, on the surface of the electron transport layer 3 include the method described in Japanese Unexamined Patent Application Publication No. 2008-174677.

In the forming method, o-phthalodinitrile is dispersed in triethylene glycol monomethyl ether. Then, titanium tetrabutoxide and O-methylisourea hemisulfate are added, and the mixture is heated at 145 to 155° C. for 5 hours. After cooling, the precipitated crystals are filtered and dried to obtain crude titanyl phthalocyanine. The crude titanyl phthalocyanine is mixed with the inorganic core particle 2, which has the electron transport layer 3, in concentrated sulfuric acid and stirred for 1 hour. Then, the mixture is added dropwise to cold water cooled to 5° C. or lower, over a period of 30 minutes while maintaining the temperature at 5° C. or lower (acid paste treatment). The precipitated crystals are filtered and sufficiently washed with water to obtain a wet cake. Tetrahydrofuran is added to the wet cake obtained above and stirred at 10° C. or lower for 2 hours. Water is added thereto, and the mixture is stirred at room temperature for 30 minutes and left overnight. The supernatant is removed, and water is then added. The mixture is stirred at room temperature for 30 minutes and filtered. The obtained wet cake is frozen in a freezer, and then returned to room temperature and filtered. The obtained crystal is dried at 100° C. for 8 hours, thereby completing growth of a Y-type titanyl phthalocyanine crystal on the electron transport layer 3.

The TiN used for the electron transport layer 3 has a strong sulfuric acid resistance, and is suitable for growing a titanyl phthalocyanine crystal in concentrated sulfuric acid.

Figure 7:
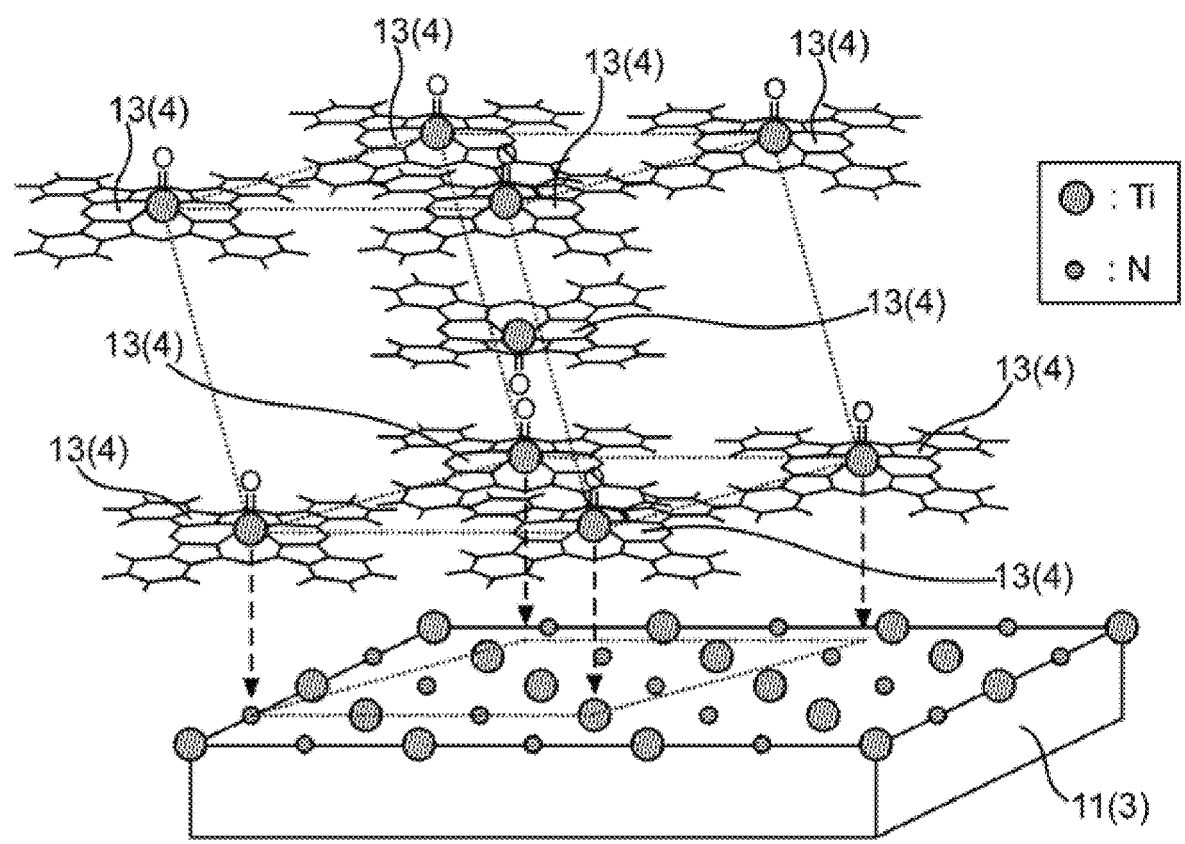
FIG. 7 is an explanatory diagram of crystal growth of titanyl phthalocyanine (light absorption layer) on the surface of a TiN layer (electron transport layer).
Figure 8:
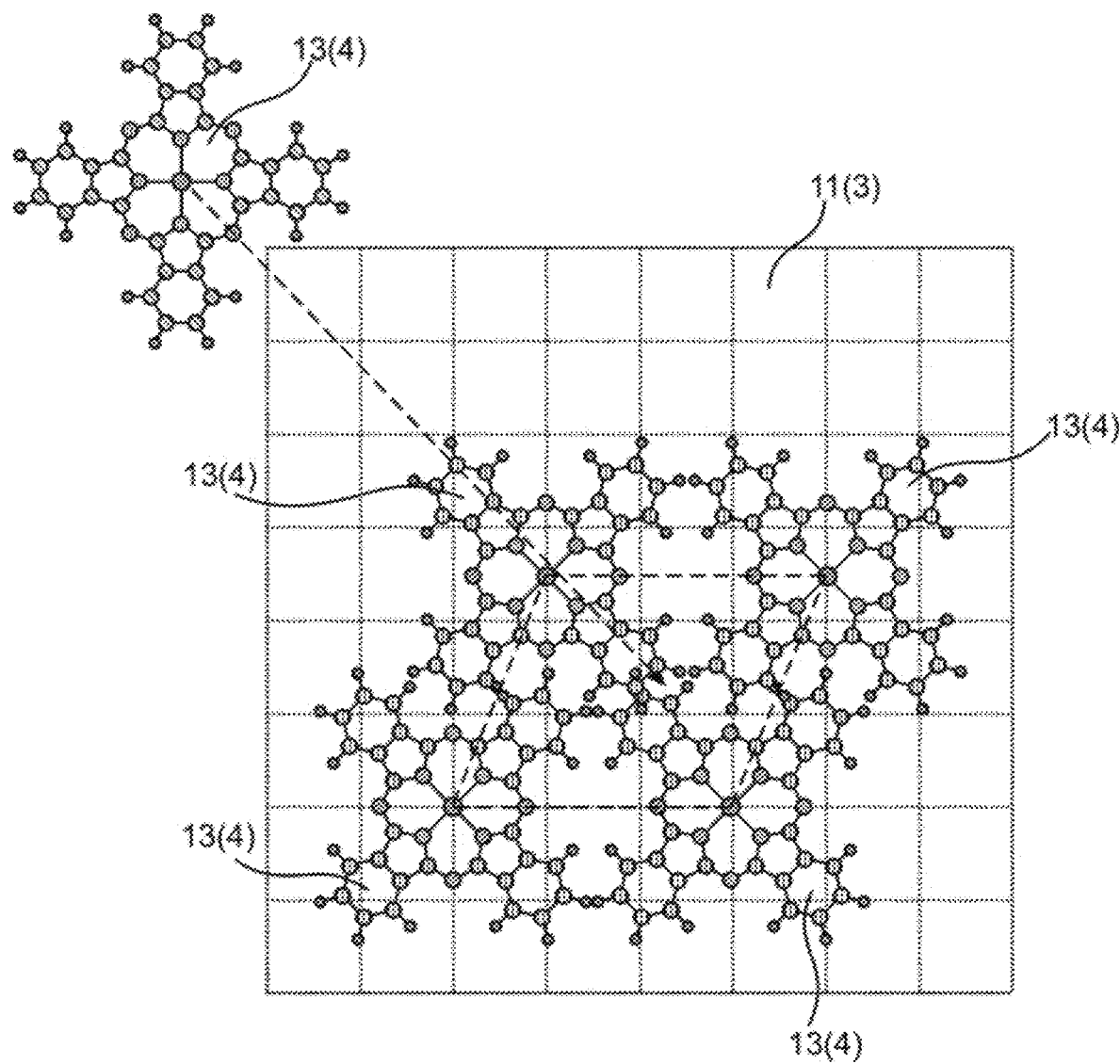
FIG. 8 is an explanatory diagram of crystal growth of titanyl phthalocyanine (light absorption layer) on the surface of a TiN layer (electron transport layer).

FIG. 7 and FIG. 8 represent schematic diagrams illustrating the crystal growth orientation of a Phase II-type titanyl phthalocyanine crystal on the surface of a TiN layer 11 serving as the electron transport layer 3. A Phase II-type titanyl phthalocyanine crystal is obtained when the amount of added water is changed in the Y-type titanyl phthalocyanine crystal forming method described above. The titanyl phthalocyanine crystal becomes an orthorhombic crystal due to the difference in the water content (see Table 1). The face on the bottom surface of the orthorhombic crystal (b=1.26 nm) corresponds to three times the lattice constant of the TiN of the TiN layer 11. Because the lattice mismatch of 1% provides lattice matching, Phase II-type titanyl phthalocyanine can grow in a crystalline form on the TiN surface, and the formation of defects at the interface between the TiN layer 11 and the Phase II-type titanyl phthalocyanine crystal can be suppressed.

FIG. 8 illustrates the crystal growth orientation of a Phase II-type titanyl phthalocyanine crystal from directly above the surface of the TiN layer 11.

The hybrid particle 5, whose light absorption layer 4 is the Y-type or Phase II-type titanyl phthalocyanine crystal described above, has an electronic structure where the energy band structure takes a similar form to the energy band structure of the hybrid particle 5 of the first embodiment illustrated in FIG. 3. That is to say, as illustrated in FIG. 3, the electron transport layer 3 sandwiched between the inorganic core particle 2 and the light absorption layer 4 has an electron quantum well structure, and has a structure in which the electrons generated in the light absorption layer 4 are accumulated in the electron transport layer 3.

Other configurations are the same as those of the first embodiment. Furthermore, as long as there is no contradiction, the description of the first embodiment is also applicable to the second embodiment.

Third Embodiment

The first and second embodiments described the hybrid particle 5. In the third embodiment, a photoelectric conversion element including the hybrid particle 5 of the first or second embodiment will be described. FIG. 9, FIG. 11, and FIGS. 12A, 12B, and 12C are cross-sectional views of the photoelectric conversion element of the present embodiment. FIG. 10, FIG. 13, FIG. 14, and FIG. 15 are energy band diagrams of the photoelectric conversion element according to the present embodiment.

The photoelectric conversion element 15 according to the present embodiment includes a first electrode 8, a charge separation layer 6 provided on the first electrode 8, and a second electrode 9 provided on the charge separation layer 6, wherein the charge separation layer 6 includes a hole transport layer 7 and a plurality of hybrid particles 5 of the first or second embodiment, and the plurality of hybrid particles 5 are covered by the hole transport layer 7.

The photoelectric conversion element 15 is an element that converts light into electrical energy. Electrons generated as a result of the light absorption layer 4 absorbing light migrate to the first electrode 8, and holes generated as a result of the light absorption layer 4 absorbing light migrate to the second electrode 9. Consequently, an electromotive force is generated between the first electrode 8 and the second electrode 9.

The first electrode 8 is an electrode (cathode) into which electrons flow from the charge separation layer 6. The first electrode 8 may be an electrode on the light receiving surface side, or may be an electrode on the back surface side. When the first electrode 8 is an electrode on the light receiving surface side, the first electrode 8 can be a comb-shaped electrode, a transparent electrode, or the like. In the photoelectric conversion element 15 illustrated in FIG. 9 and FIG. 11 and the like, the first electrode 8 is an electrode on the back surface side.

When the first electrode 8 is an electrode on the back surface side, the first electrode 8 can be an electrode serving as a substrate of the photoelectric conversion element 15. In this case, the first electrode 8 has a flat plate shape or a substantially cylindrical shape, and is preferably made of a metallic material such as aluminum, nickel, magnesium, iron, tin, titanium, gold, silver, copper, tungsten, an alloy of these metals, or stainless steel.

The first electrode 8 may be a stacked electrode, in which a metal plate serving as a substrate and a conductive layer stacked on the metal plate are stacked. The conductive layer is formed of, for example, a conductive transparent material such as aluminum-doped zinc oxide (AZO), indium zinc oxide (IZO), or gallium-doped zinc oxide (GZO), or a cathode material such as sodium, a sodium-potassium alloy, lithium, magnesium, aluminum, a magnesium-silver mixture, a magnesium-indium mixture, an aluminum-lithium alloy, an aluminum-aluminum oxide ($Al/Al_2O_3$) mixture, or an aluminum-lithium fluoride (Al/LiF) mixture. These materials may be used alone or in combination of two or more. The film thickness of the conductive layer is not particularly limited, but is preferably 200 nm or less. The conductive layer may be a film on the surface of the substrate (on the charge separation layer side).

Furthermore, it is desirable that the work function of the surface of the first electrode 8 (on the charge separation layer side) is greater (at a shallower level) than −4.6 eV when the vacuum level is 0 eV.

The photoelectric conversion element 15 includes the charge separation layer 6 provided on the first electrode 8. The charge separation layer 6 includes the hybrid particle 5 of the first or second embodiment and the hole transport layer 7. The hybrid particle 5 has been described in the first or second embodiment. Therefore, the same description to that of the first or second embodiment will be omitted here.

The charge separation layer 6 is a layer that separates the photoexcited carriers generated as a result of the light absorption layer 4 of the hybrid particle 5 absorbing light into electrons and holes. The photoexcited electrons from the light absorption layer 4 flow to the first electrode 8 via the electron transport layer 3 of the hybrid particle 5. The holes generated in the light absorption layer 4 flow to the second electrode 9 via the hole transport layer 7.

The charge separation layer 6 can include a porous layer containing a plurality of the hybrid particles 5. Furthermore, the porous layer can be provided so as to make contact with the first electrode 8. Consequently, the photoexcited electrons from the light absorption layer 4 are capable of migrating to the first electrode 8.

The hole transport layer 7 is a layer that captures the holes generated as a result of the light absorption layer 4 absorbing light, and transports the holes to the second electrode 9 serving as the anode. The hole transport layer 7 can be provided so as make contact with the light absorption layer 4 of the hybrid particles 5. Moreover, the hole transport layer 7 can be provided inside the pores of the porous layer containing the hybrid particles 5. Consequently, the holes generated in the light absorption layer 4 are capable of migrating to the hole transport layer 7. In addition, the hole transport layer 7 can be provided so as to make contact with the second electrode 9. Consequently, the holes in the hole transport layer 7 are capable of migrating to the second electrode 9.

The hole transport layer 7 is mainly composed of a hole transport material. Specifically, the hole transport layer 7 preferably contains 70 wt % or more of a hole transport material, and more preferably contains 85 to 100 wt % of a hole transport material. The hole transport layer 7 may be composed solely of a hole transport material, without including an organic binder resin, a plasticizer, or the like.

The hole transport material included in the hole transport layer 7 may be a material having a melting point of 120° C. or higher and 170° C. or lower. If the melting point of the hole transport material is lower than 120° C., the hole transport material may melt during use of the photoelectric conversion element 15, and the photoelectric conversion element 15 may become unusable. If the melting point of the hole transport material exceeds 170° C., the crystal of the light absorption layer 4 may break and cause the photoelectric conversion characteristics of the photoelectric conversion element 15 to deteriorate when the molten hole transporting material is filled inside the pores of the porous layer, which contains a large number of the hybrid particles 5.

A material having a melting point of 170° C. or lower is used as the hole transport material. Specifically, a pyrazoline compound, an arylamine compound, a stilbene compound, an enamine compound, a polypyrrole compound, a polyvinylcarbazole compound, a polysilane compound, a butadiene compound, a polysiloxane compound having an aromatic amine on a side chain or on the main chain, a polyaniline compound, a polyphenylenevinylene compound, a polythienenevinylene compound, a polythiophene compound, or the like can be used. However, a butadiene compound or a bisbutadiene compound are particularly preferable. By using such a hole transport material, a photoelectric conversion element 15 having a high photoelectric conversion efficiency can be obtained.

The hole transport material is preferably a compound that does not easily undergo crystallization. Further, the hole transport layer 7 may be configured to include an organic binder resin or a plasticizer or the like in order to prevent crystallization of the hole transport material with certainty. However, the addition amount of the organic binder resin or the plasticizer or the like is set to a small amount so that the hole transport capability of the hole transport layer 7 is not significantly reduced.

The film thickness of the charge separation layer 6 (the film thickness of the hole transport layer 7) (the film thickness from the surface of the first electrode 8) is preferably about 1 to 2 μm, and more preferably about 1 μm. If the hole transport layer 7 has such a film thickness, the holes generated in the light absorption layer 4 can smoothly and efficiently migrate to the second electrode 9, which serves as the anode. The hole transport layer 7 needs to be transparent and is preferably an amorphous layer. In order to obtain a high charge transport capability, the hole transport layer 7 may include an ion conductive agent such as lithium(trifluoromethanesulfone)imide (LiTFSI).

The photoelectric conversion element 15 includes the second electrode 9 provided on the charge separation layer 6. The second electrode 9 is an electrode (anode) into which holes flow from the charge separation layer 6. The second electrode 9 may be an electrode on the light receiving surface side, or may be an electrode on the back surface side. In the photoelectric conversion element 15 illustrated in FIG. 9 and FIG. 11 and the like, the second electrode 9 is an electrode on the light receiving surface side.

When the second electrode 9 is an electrode on the light receiving surface side, the second electrode 9 can be a comb-shaped electrode, a transparent electrode, or the like. The second electrode 9 can be provided so as to make contact with the hole transport layer 7 of the charge separation layer 6. As a result, the holes generated in the light absorption layer 4 of the hybrid particles 5 can migrate to the second electrode 9, which serves as the anode, via the hole transport layer 7.

The anode material that can be used for the second electrode 9 is not particularly limited. For example, metals such as gold, silver and platinum, conductive transparent materials such as copper iodide (CuI), indium tin oxide (ITO), tin oxide ($SnO_2$), fluorine-doped tin oxide (FTO), aluminum-doped zinc oxide (AZO), indium zinc oxide (IZO), and gallium-doped zinc oxide (GZO), conductive fine particles such as silver nanowires and carbon nanofibers, and conductive polymers such as PEDOT/PSS can be preferably used. These materials may be used alone or in combination of two or more. It is desirable that the work function of the second electrode 9 is smaller (at a deeper level) than −4.6 eV when the vacuum level is 0 eV. As a result, the holes generated in the light absorption layer 4 of the hybrid particle 5 can efficiently migrate to the second electrode 9. Furthermore, when the second electrode 9 is an electrode on the light receiving surface side, the second electrode 9 is preferably a transparent electrode, or a semi-transparent electrode.

The photoelectric conversion element 15 can have a protective layer 10 provided on the second electrode 9. The protective layer 10 can be made of a material having high gas barrier properties, such as the resin plate or wrap film used to form the second electrode 9, or glass, and is capable of preventing deterioration inside the photoelectric conversion element 15 caused by the moisture or oxygen in the air. When the photoelectric conversion element 15 has the protective layer 10, the outer surface of the photoelectric conversion element 15 can be protected from impacts and scratches when the photoelectric conversion element 15 is installed or the like. In addition, the protective layer 10 can have a light transmitting property.

When the material of the protective layer 10 is a resin, protective layer 10 needs to have a heat resistance higher than the melting point of the hole transport material, and a heat resistance up to about 170° C. The protective layer 10 is specifically made of polyethylene terephthalate (PET), polybutylene terephthalate (PBT), polyphenylene sulfide (PPS), polyetherimide (PEI), polytetrafluoroethylene (PTFE), polyamideimide (PAI), silicone, or the like. However, other resins can be used as long as the requirements are satisfied.

The photoelectric conversion element 15 can be formed as follows. The hybrid particles 5 are applied to the first electrode 8 (substrate) by using an application method such as a screen printing method or a dip coating method to form a coating film, and the coating film is dried. As a result, a porous layer mainly composed of the hybrid particles 5 can be formed on the first electrode 8, and the photoexcited electrons from the light absorption layer 4 of the hybrid particles 5 can be efficiently extracted to the first electrode 8, which serves as the cathode, via the electron transport layer 3.

Next, the hole transport layer 7 is formed on the porous layer and inside the pores of the porous layer (on the light absorption layer 4 of the hybrid particles 5). The forming method of the hole transport layer 7 and beyond is not particularly limited in terms of the materials and manufacturing method. A plurality of forming methods will be described below.

First method: After forming the second electrode 9 on the protective layer 10, a powder of the hole transport material is scattered on the second electrode 9, and the hole transport material is heated to its melting point to form a molten film for casting. The first electrode 8 (substrate) and the porous layer of the hybrid particles 5 formed thereon are heated in advance. Then, the first electrode 8 and the protective layer 10 are stacked and pressed so that the molten film of the hole transport material is pressed against the porous layer of the hybrid particles 5. Then, the stacked body is gradually cooled. As a result, the hole transport layer 7 can be provided inside the pores of the porous layer of the hybrid particles 5, and the area in which the light absorption layer 4 on the surface of the hybrid particles 5 makes contact with the hole transport layer 7 can be increased. The hybrid particles 5 constituting the porous layer may be dispersed inside the hole transport layer 7 when the molten film of the hole transport material is pressed against the porous layer.

Second method: After forming the second electrode 9 on the protective layer 10, a solution containing the hole transport material dissolved in a solvent is applied and dried on the second electrode 9 to form a film of the hole transport material. Then, the film is heated to the melting point of the hole transport material to form a molten film for casting. The first electrode 8 (substrate) and the porous layer of the hybrid particles 5 formed thereon are heated in advance. Then, the first electrode 8 and the protective layer 10 are stacked and pressed so that the molten film of the hole transport material is pressed against the porous layer of the hybrid particles 5. Then, the stacked body is gradually cooled.

Third method: A powder of the hole transport material is scattered on the porous layer of the hybrid particles 5 formed on the first electrode 8 (substrate). Then, the hole transport material is heated to its melting point to form a molten film for casting. The protective layer 10 and the second electrode 9 formed thereon are heated in advance. Then, the first electrode 8 and the protective layer 10 are stacked and pressed so that the second electrode 9 is pressed against the molten film of the hole transport material. Then, the stacked body is gradually cooled.

Fourth method: A solution containing the hole transport material dissolved in a solvent is applied and dried on the porous layer of the hybrid particles 5 formed on the first electrode 8 (substrate) to form a film of the hole transport material. Then, the film is heated to the melting point of the hole transport material to form a molten film for casting. The protective layer 10 and the second electrode 9 formed thereon are heated in advance. Then, the first electrode 8 and the protective layer 10 are stacked and pressed so that the second electrode 9 is pressed against the molten film of the hole transport material. Then, the stacked body is gradually cooled.

The organic solvent used when applying the solution of the hole transport material on the porous layer of the hybrid particles 5 is preferably a solvent that does not disturb the crystal structure of the light absorption layer 4 (perovskite structure compound or metal complex). Specifically, chlorobenzene, toluene and the like are suitable. Furthermore, the application method is not particularly limited. However, for example, a dip coating method, a spray coating method, a slide hopper coating method and the like are preferable.

The photoelectric conversion element 15 is completed by the manufacturing method described above.

Hereinafter, the operation principle of the photoelectric conversion element 15 will be described.

Figure 9:
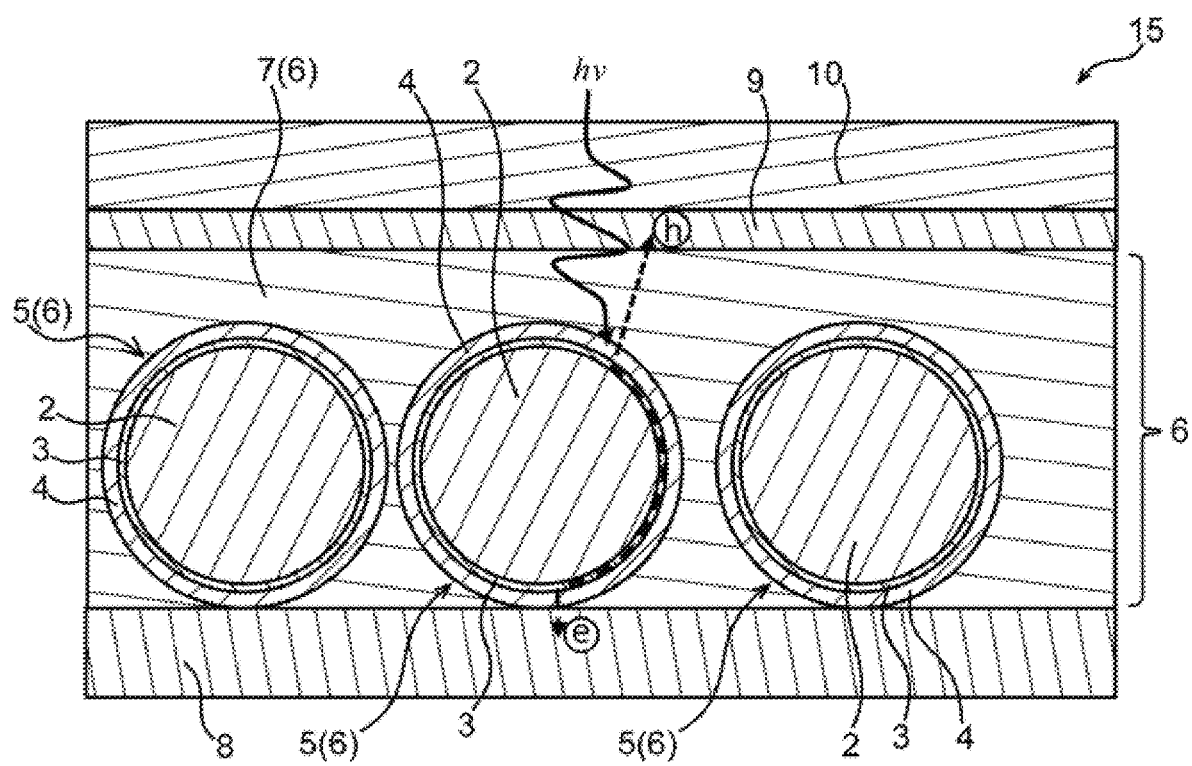
FIG. 9 is a schematic cross-sectional view of a photoelectric conversion element according to an embodiment of the present invention.
Figure 10:
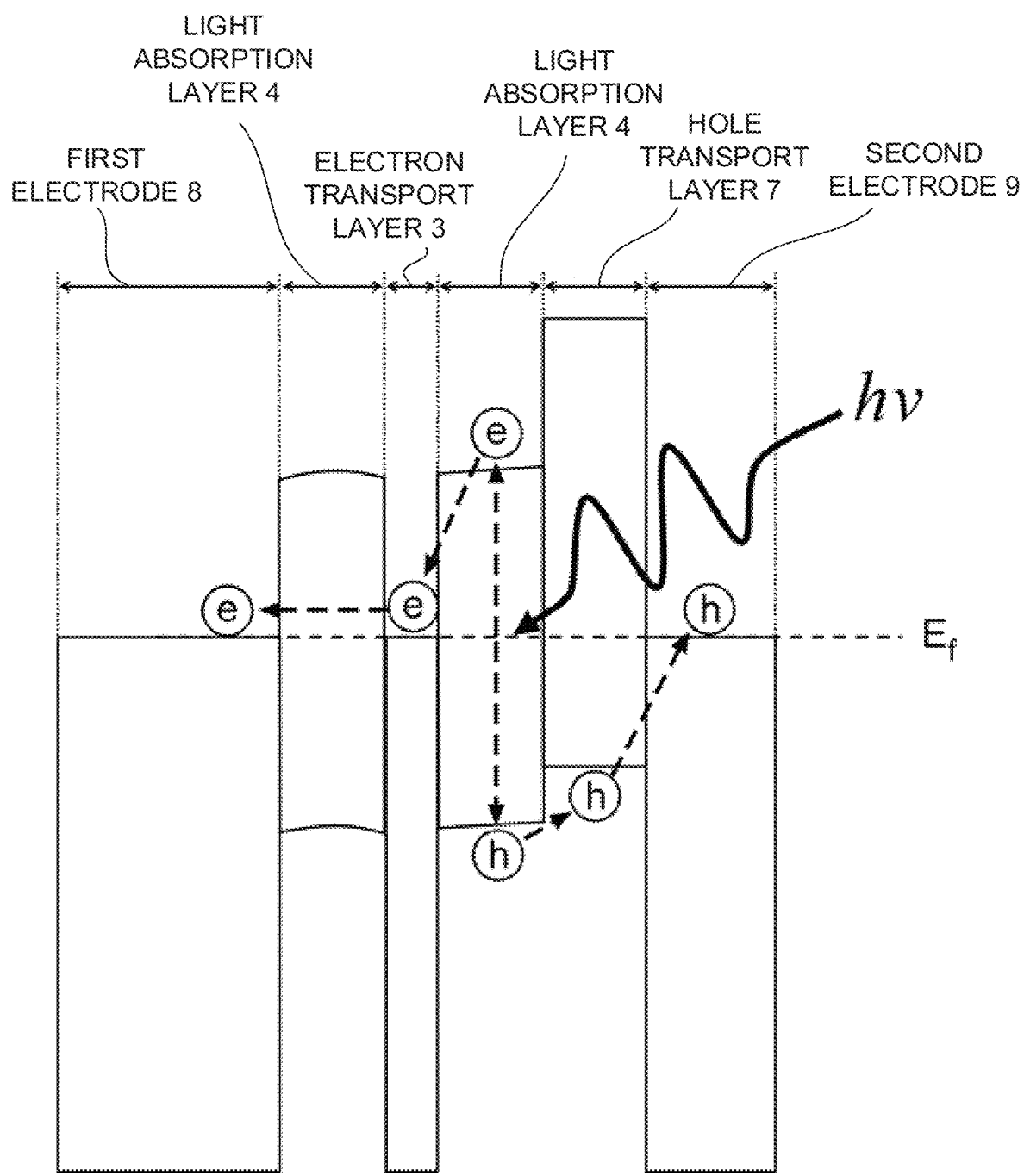
FIG. 10 is an energy band diagram of a photoelectric conversion element according to an embodiment of the present invention.

As illustrated in FIG. 9, when light enters from the protective layer 10 and the hybrid particles 5 are irradiated with light, electrons and holes are generated in the light absorption layer 4 within the hybrid particles 5. The electrons generated in the light absorption layer 4 are transported along the electron transport layer 3, which is sandwiched between the inorganic core particle 2 and the light absorption layer 4, and are transported to the first electrode 8 by conducting or tunneling through the light absorption layer 4 on the first electrode 8 side. Charge separation is performed as a result of the holes generated in the light absorption layer 4 being extracted to the second electrode 9 via the hole transport layer 7. FIG. 10 illustrates the series of photoexcited carrier transport mechanisms described above as a flow of photoexcited carriers in the energy bands of the photoelectric conversion element 15, which uses the hybrid particles 5.

Figure 11:
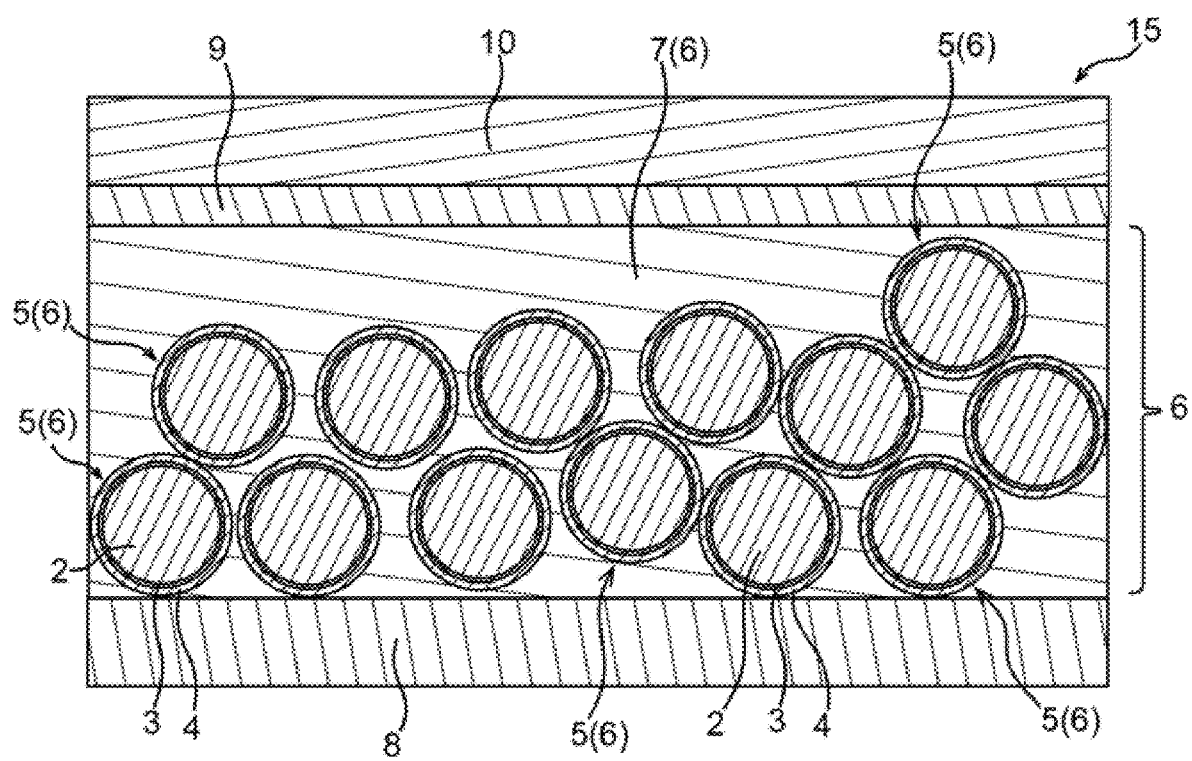
FIG. 11 is a schematic cross-sectional view of a photoelectric conversion element according to an embodiment of the present invention.

FIG. 11 is a schematic cross-sectional view of the photoelectric conversion element 15 that has been formed by a method that forms a porous layer of hybrid particles 5, and then presses a molten film of a hole transport material against the porous layer. Some of the hybrid particles 5 included in the charge separation layer 6 are aggregated, and some are dispersed within the hole transport layer 7.

Figure 12A:
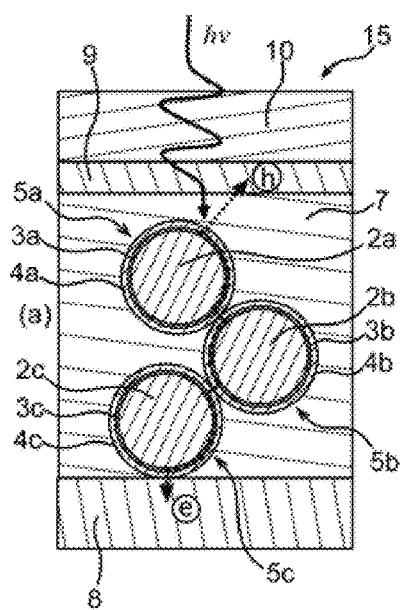
FIGS. 12A, 12B, and 12C are schematic cross-sectional views of a photoelectric conversion element according to an embodiment of the present invention.
Figure 12B:
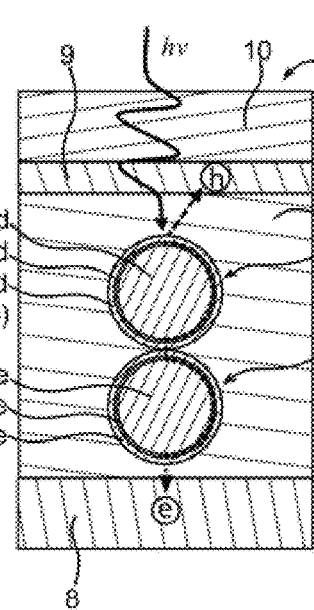
Figure 12C:
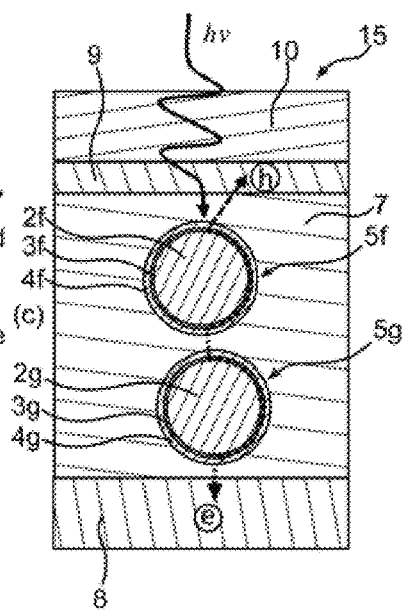

FIGS. 12A and 12B illustrate representative cases by classifying the characteristic flows of photoexcited carriers in such a photoelectric conversion element 15. FIG. 12A illustrates a case where a plurality of hybrid particles 5 are joined, and the hybrid particles 5 are making contact with the first electrode 8. FIG. 12B illustrates a case where a plurality of hybrid particles 5 are joined, and the hybrid particles 5 are not making contact with the first electrode 8. FIG. 12C illustrates a case where the hybrid particles 5 are not joined, and the hybrid particles 5 are not making contact with the first electrode 8.

Figure 13:
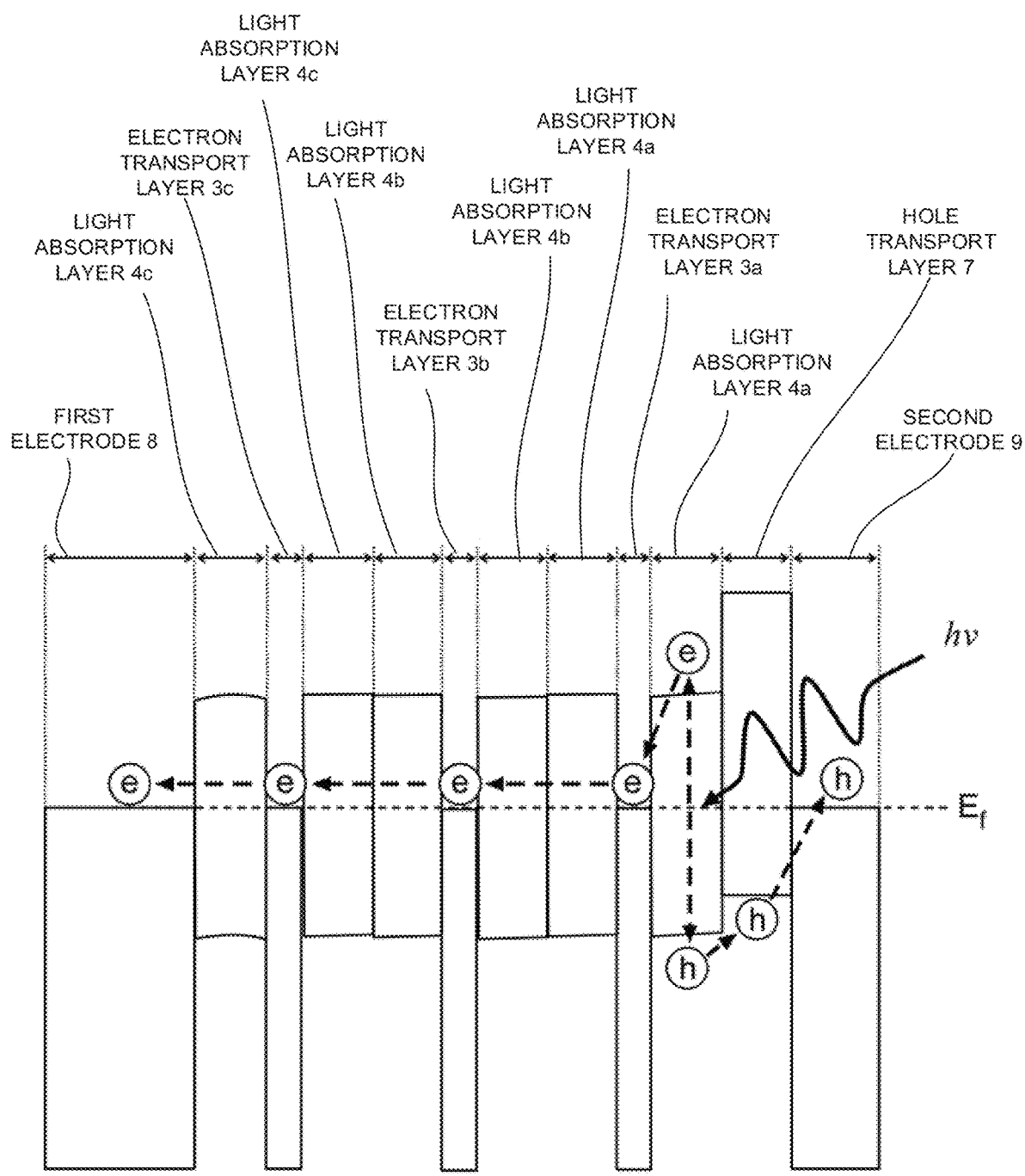
FIG. 13 is an energy band diagram of the photoelectric conversion element illustrated in FIG. 12A.

FIG. 13 illustrates, for the case illustrated in FIG. 12A, the generation of carriers within the energy bands of the photoelectric conversion element 15, and the flow of the carriers. In this case, the electron generated in the light absorption layer 4a of the hybrid particle 5a flows through the electron transport layer 3a of the hybrid particle 5a, and flows to the electron transport layer 3b of the hybrid particle 5b by conducting or tunneling through the light absorption layers 4a and 4b. The electron in the electron transport layer 3b flows to the electron transport layer 3c of the hybrid particle 5c by conducting or tunneling through the light absorption layers 4b and 4c. The electron in the electron transport layer 3c flows to first electrode 8 by conducting or tunneling through the light absorption layer 4c. On the other hand, the hole generated in the light absorption layer 4a of the hybrid particle 5a migrates to the hole transport layer 7, and flows to the second electrode 9. The electron and hole can be separated in this manner, and a photoelectromotive force can be generated between the first electrode 8 and the second electrode 9.

Figure 14:
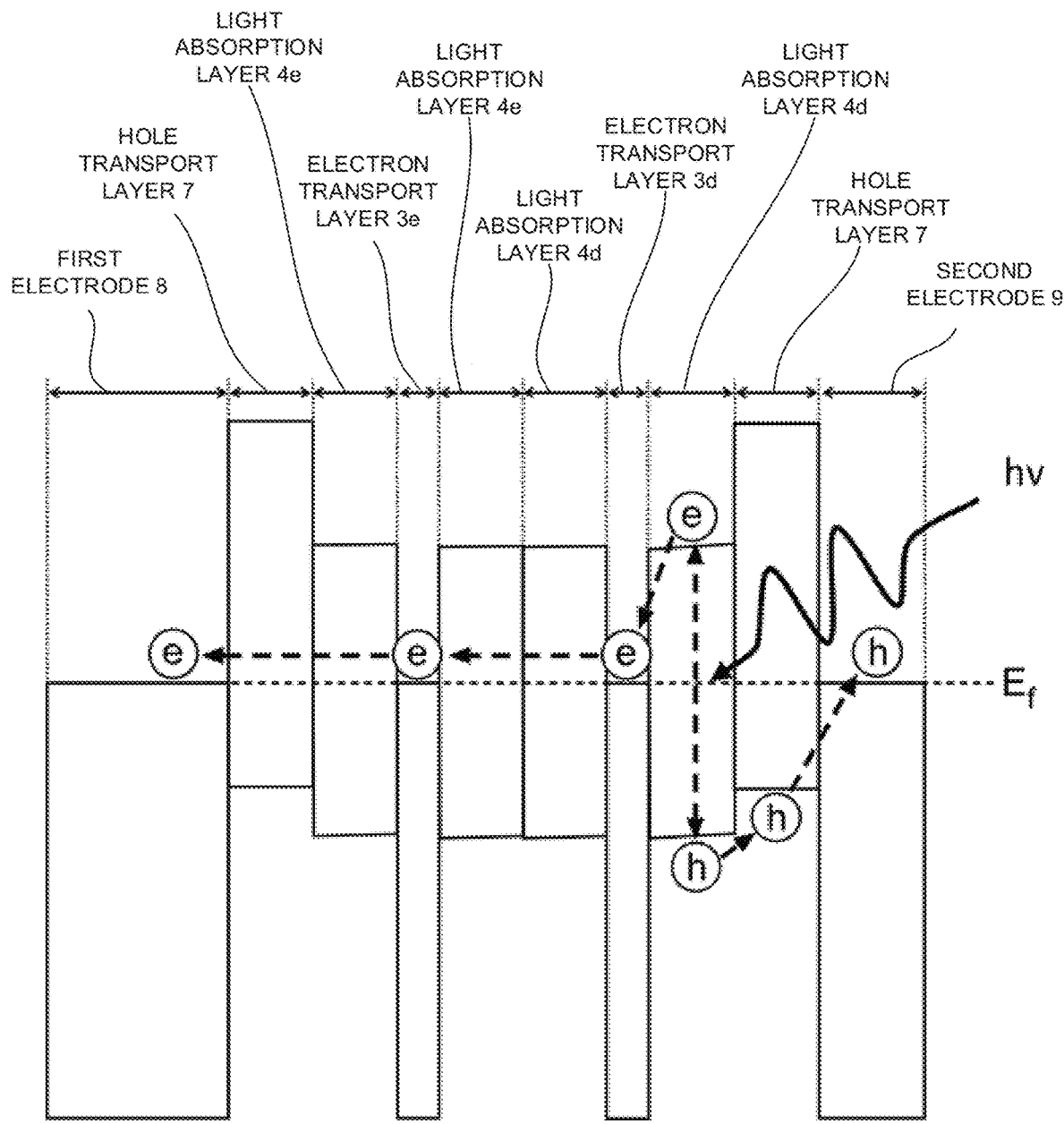
FIG. 14 is an energy band diagram of the photoelectric conversion element illustrated in FIG. 12B.

FIG. 14 illustrates, for the case illustrated in FIG. 12B, the generation of carriers within the energy bands of the photoelectric conversion element 15, and the flow of the carriers. In this case, the electron generated in the light absorption layer 4d of the hybrid particle 5d flows through the electron transport layer 3d of the hybrid particle 5d, and flows to the electron transport layer 3e of the hybrid particle 5e by conducting or tunneling through the light absorbing layers 4d and 4e. The electron in the electron transport layer 3e flows to the first electrode 8 by conducting or tunneling through the light absorption layer 4e and the hole transport layer 7. On the other hand, the hole generated in the light absorption layer 4d of the hybrid particle 5d migrates to the hole transport layer 7, and flows to the second electrode 9. The electron and hole can be separated in this manner, and a photoelectromotive force can be generated between the first electrode 8 and the second electrode 9.

Figure 15:
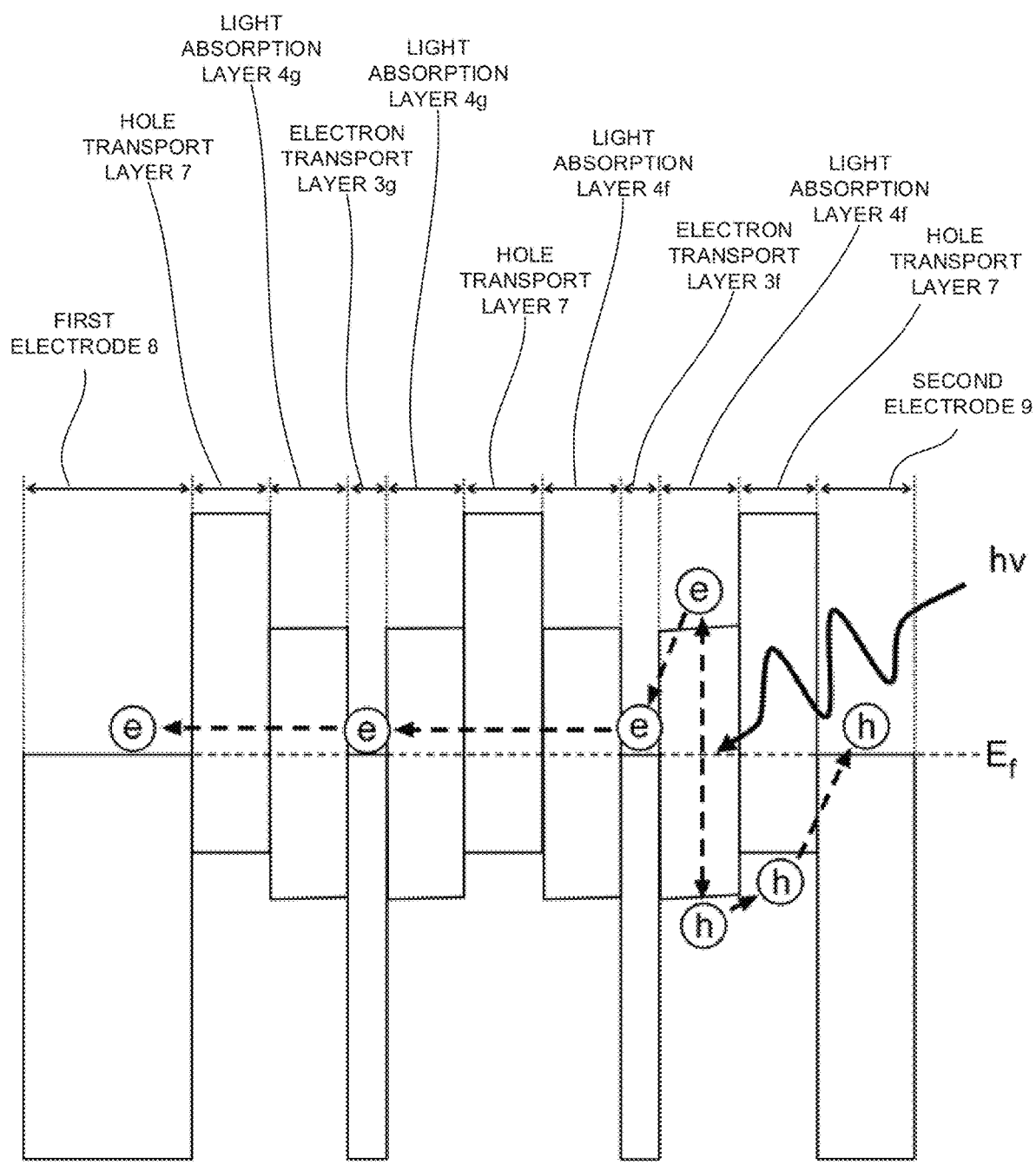
FIG. 15 is an energy band diagram of the photoelectric conversion element illustrated in FIG. 12C.

FIG. 15 illustrates, for the case illustrated in FIG. 12C, the generation of carriers within the energy bands of the photoelectric conversion element 15, and the flow of the carriers. In this case, the electron generated in the light absorption layer 4f of the hybrid particle 5f flows through the electron transport layer 3f of the hybrid particle 5f, and flows to the electron transport layer 3g of the hybrid particle 5g by conducting or tunneling through the light absorption layer 4f, the hole transport layer 7, and the light absorption layer 4g. The electron in the electron transport layer 3g flows to the first electrode 8 by conducting or tunneling through the light absorption layer 4g and the hole transport layer 7. On the other hand, the hole generated in the light absorption layer 4f of the hybrid particle 5f migrates to the hole transport layer 7, and flows to the second electrode 9. The electron and hole can be separated in this manner, and a photoelectromotive force can be generated between the first electrode 8 and the second electrode 9.

The description of the hybrid particle 5 in the first and second embodiments also applies to the hybrid particles 5 included in the photoelectric conversion element 15 of the third embodiment.

Fourth Embodiment

The first and second embodiments described the hybrid particle 5. In the fourth embodiment, a photosensitive body including the hybrid particle 5 of the first or second embodiment will be described.

Figure 16:
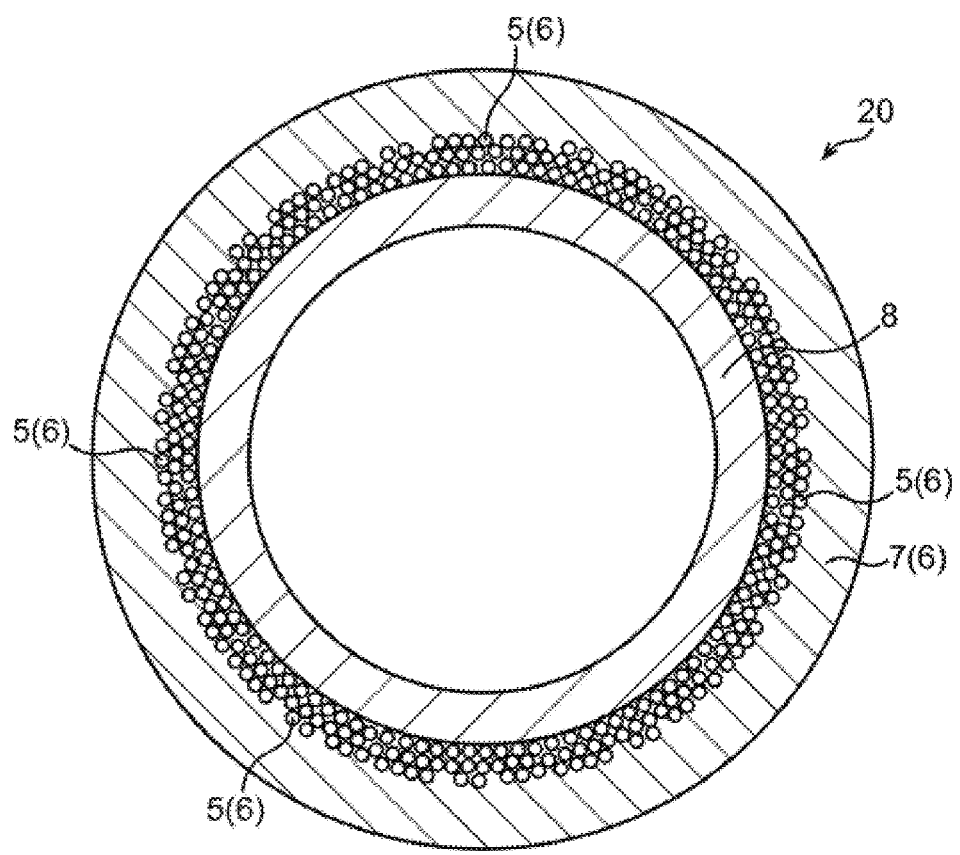
FIG. 16 is a schematic cross-sectional view of a photosensitive body according to an embodiment of the present invention.
Figure 17:
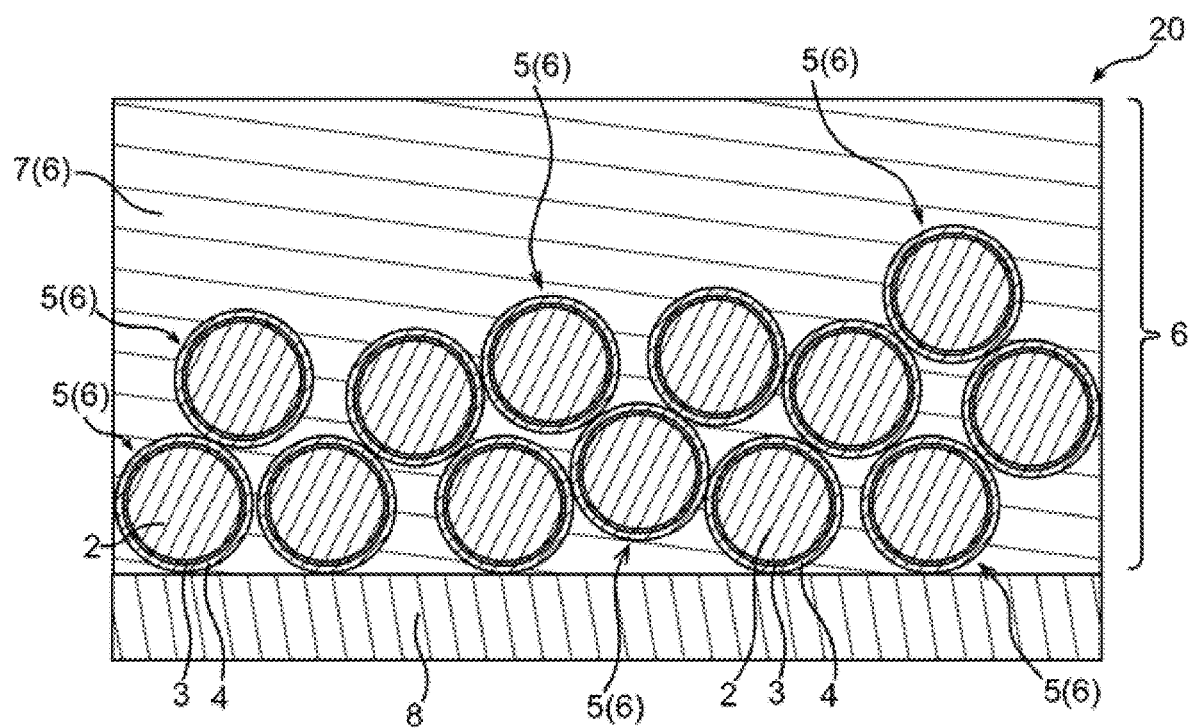
FIG. 17 is a schematic cross-sectional view of a photosensitive body according to an embodiment of the present invention.

FIGS. 16 and 17 are schematic cross-sectional views of a photosensitive body according to the present embodiment.

The photosensitive body 20 according to the present embodiment includes a first electrode 8 and a charge separation layer 6 provided on the first electrode 8, wherein the charge separation layer 6 includes a hole transport layer 7, and a plurality of hybrid particles 5 of the first or second embodiment, and the plurality of hybrid particles 5 are covered by the hole transport layer 7. By using such a high-efficiency photosensitive body in the photosensitive drum of a copier, the image quality of the copier can be improved.

As illustrated in FIG. 16, the photosensitive body 20 can have a cylindrical shape, such that the first electrode 8 is disposed on the inside and the charge separation layer 6 is disposed on the outside. The outer peripheral surface of the photosensitive body 20 serves as the hole transport layer 7. FIG. 17 is an enlarged cross-sectional view of the photosensitive body 20.

The photosensitive body 20 is one of the main components of an image forming apparatus. It is a component that receives light that includes image information to form an electrostatic latent image, and forms a toner image by attaching toner to the electrostatic latent image. The photosensitive body 20 of the present embodiment has a structure similar to that of the photoelectric conversion element 15 of the third embodiment. However, as illustrated in FIG. 16 and FIG. 17, it does not include the second electrode 9 and the protective layer 10.

In the photosensitive body 20 of the present embodiment, the surface of the hole transport layer 7 is negatively charged before the photosensitive body 20 is irradiated with light. The holes that are generated as a result of the light absorption layer 4 of the hybrid particles 5 absorbing light migrate to the hole transport layer 7, and combine with the electrons on the surface of the hole transport layer 7. Therefore, within the surface of the hole transport layer 7, the electrons in those sections that are irradiated with light are eliminated due to recombination with holes. Consequently, only the electrons in those sections that are not irradiated with light remain, which results in the formation of an electrostatic latent image on the surface of the hole transport layer 7.

The description of the hybrid particle 5 in the first and second embodiments applies to the hybrid particles 5 included in the photosensitive body 20 of the present embodiment. Furthermore, as long there is no, the description of the first electrode 8, the charge separation layer 6, and the hole transport layer 7 in the third embodiments applies to the first electrode 8, the charge separation layer 6, and the hole transport layer 7 included in the photosensitive body 20 of the present embodiment.

In the photosensitive body 20 of the present embodiment, the film thickness of the charge separation layer 6 (film thickness of the hole transport layer 7) is preferably 10 to 50 μm. Furthermore, in the photosensitive body 20, in order to improve the printing durability of the hole transport layer 7, the hole transport layer 7 may include, in addition to the hole transport material described in the third embodiment, a resin of the charge transport materials having a film-forming property, a filler material, or an organic solvent.

Other compounds used in the field can also be used as the bole transport material included in the hole transport layer 7. Specific examples include hole transport materials such as carbazole dielectrics, imidazole dielectrics, oxazole dielectrics, thiadiazole dielectrics, polycyclic aromatic-based compounds, aniline-based compounds, hydrazone-based compounds, aromatic amine-based compounds, triphenylamine-based compounds and their dimers, triphenylmethane-based compounds, tetraphenylbutadiene-based compounds, enamine-based compounds, stilbenzene-based compounds, polymers such as poly-N-vinylcarbazole having a group derived from these compounds in the main chain or in a side chain, and hole transport materials such as fluorene dielectrics, dibenzothiophene dielectrics, indenothiophene dielectrics, phenanthrenequinone dielectrics, indenopyridine dielectrics, thioxanthone dielectrics, benzo[c]cinnoline dielectrics, phenazine oxide dielectrics, tetracyanoethylene, tetracyanoquinodimethane, promanyl, chloranil, and benzoquinone. These hole transport materials can be used alone or in combination of two or more.

A resin having a film-forming property is capable of improving the mechanical strength and durability of the hole transport layer 7, the binding property between layers, and the like. A resin having a binding property used in the field can be used.

Specific examples include vinyl-based resins such as polymethyl methacrylate, polystyrene, and polyvinyl chloride, thermoplastic resins such as polycarbonate, polyester, polyester carbonate, polysulfone, polyarylate, polyamide, methacrylic resins, acrylic resins, polyether, polyacrylamide, and polyphenylene oxide, thermosetting resins such as epoxy resins, silicone resins, polyurethane, phenolic resins, alkyd resins, melamine resins, phenoxy resins, polyvinyl butyral, and polyvinyl formal, partially crosslinked products of these resins, and copolymer resins including two or more of the constituent units included in these resins (insulating resins such as vinyl chloride-vinyl acetate copolymer resins, vinyl chloride-vinyl acetate-maleic anhydride copolymer resins, and acrylonitrile-styrene copolymer resins). These resins having a film-forming property can be used alone or in combination of two or more.

The filler material may be inorganic or organic, and the average primary particle size is about 10 to 300 nm, and preferably about 20 to 200 nm. Examples of the material constituting an inorganic filler include inorganic oxides, colloidal silica, and silicon nitride. Examples of the material constituting an organic filler include fluorine-based resins, polysiloxane-based resins, and polymer charge transport materials.

Examples of the organic solvent include aromatic hydrocarbons such as toluene, xylene, mesitylene, tetralin, diphenylmethane, dimethoxybenzene, and dichlorobenzene; halogenated hydrocarbons such as dichloromethane, dichloroethane, and tetrachloropropane; ethers such as tetrahydrofuran (THF), dioxane, dibenzyl ether, dimethoxymethyl ether and 1,2-dimethoxyethane; ketones such as methyl ethyl ketone, cyclohexanone, acetophenone and isophorone; esters such as methyl benzoate, ethyl acetate, and butyl acetate; sulfur-containing solvents such as diphenyl sulfide; fluorinated solvents such as hexafluoroisopropanol; aprotic polar solvents such as N,N-dimethylformamide, N,N-dimethylacetamide, and dimethylsulfoxide; alcohols such as methanol, ethanol, and isopropanol; and glyme-based solvents such as ethylene glycol and diethylene glycol monomethyl ether. These may be used alone or as a mixed solvent.

Water may be mixed in these solvents. Among these solvents, non-halogenated organic solvents are preferably used in consideration of the global environment.

Additionally, the hole transport layer 7 may include an additive such as an antioxidant, a viscoelasticity adjuster, a preservative, or a curing catalyst.

The photosensitive body 20 can be manufactured, for example, by the following method. Firstly, the hybrid particles 5 are applied to the first electrode 8 (substrate) by using an application method such as a screen printing method or a dip coating method to form a coating film, and the coating film is dried. As a result, a porous layer mainly composed of the hybrid particles 5 can be formed on the first electrode 8. Next, a coating solution of the hole transport material is applied to the porous layer using a coating method such as a screen printing method or a dip coating method, and the hole transport layer 7 is formed around the hybrid particle 5 by drying the coating solution. The photosensitive body 20 can be manufactured in this manner.

Fifth Embodiment

The fourth embodiment described the photosensitive body 20. In the fifth embodiment, an image forming apparatus that includes the photosensitive body 20 of the fourth embodiment will be described.

Figure 18:
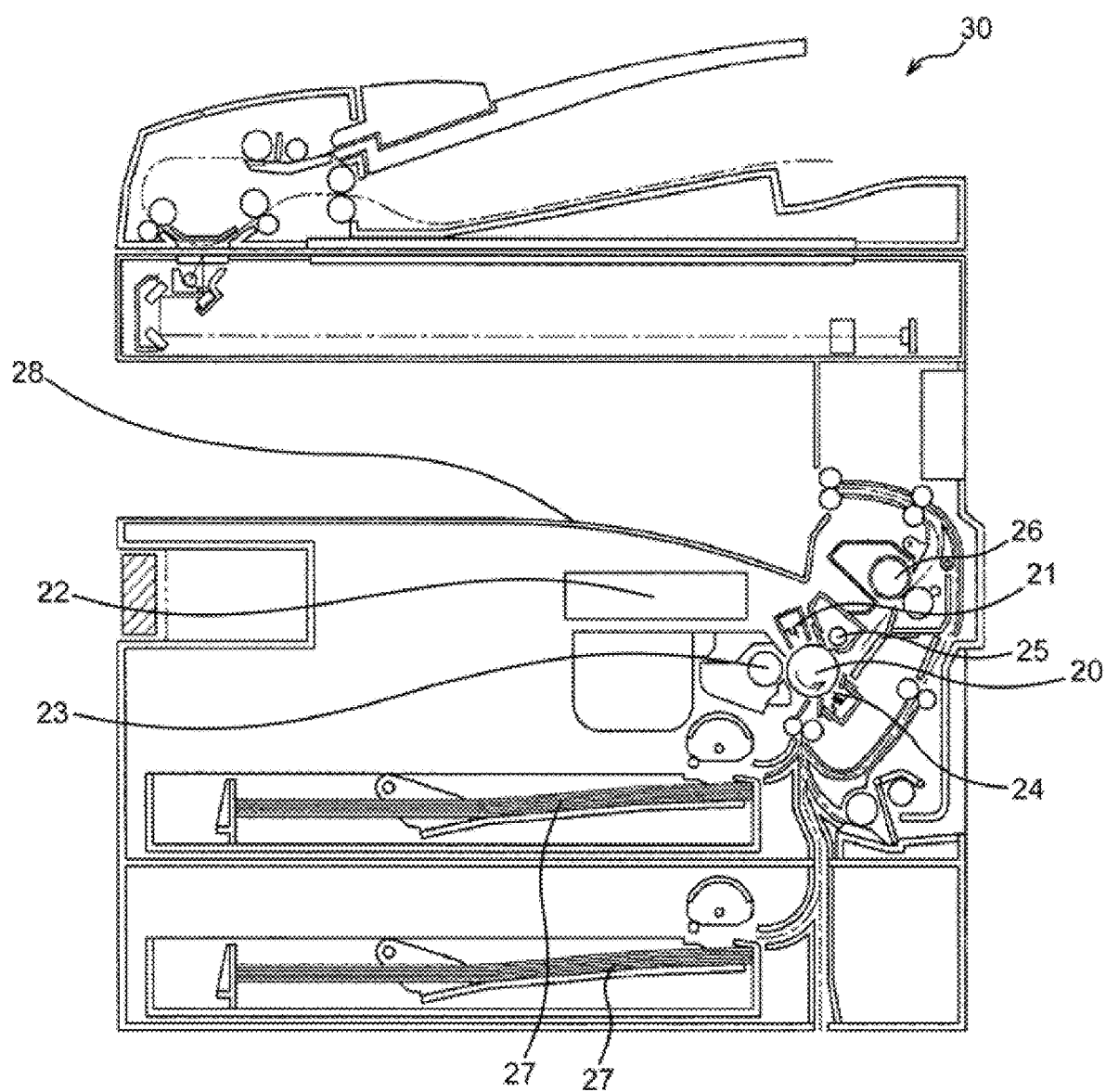
FIG. 18 is a schematic cross-sectional view of an image forming apparatus according to an embodiment of the present invention.

FIG. 18 is a schematic cross-sectional view of an image forming apparatus 30 of the present embodiment. The image forming apparatus 30 includes the photosensitive body 20 of the fourth embodiment, a charger 21, an exposure section 22, a developer 23, a transfer section 24, a cleaning section 25, a fixing section 26 and the like.

The image forming apparatus 30 forms an image as follows. First, the surface of the photosensitive body 20 (the surface of the hole transport layer 7) is charged by using the charger 21 while rotating the cylindrical photosensitive body 20. The charged photosensitive body 20 is irradiated with light that includes image information using the exposure section 22. The irradiated light is absorbed by the light absorption layer 4 of the hybrid particles 5 to generate electrons and holes. The electrons flow to the first electrode 8, and the holes flow to the charged surface of the hole transport layer 7 and recombine with the electrons such that the electrons and the holes are eliminated. For this reason, only the electrons in those sections that are not irradiated with light remain at the surface of the hole transport layer 7, and an electrostatic latent image is formed on the surface of the hole transport layer 7. A toner image is formed on the surface of the photosensitive body 20 by attaching toner to the electrostatic latent image using the developer 23. The transfer section 24 transfers the toner image onto a paper sheet, and the fixing section 26 heats the paper sheet to which the toner image has been transferred to fix the toner image to the paper sheet. As a result, an image can be printed on the paper sheet. Furthermore, the residual toner remaining on the surface of the photosensitive body 20 after the transfer is removed by the cleaning section 25.

The description of the hybrid particle 5 in the first and second embodiments also applies to the hybrid particles 5 of the photosensitive body 20 included in the image forming apparatus 30 of the fifth embodiment. The description of the photosensitive body 20 in the fourth embodiment also applies to the photosensitive body 20 included in the image forming apparatus 30 of the fifth embodiment.

BRIEF DESCRIPTION OF THE REFERENCE SYMBOLS

2: Inorganic core particle, 3: Electron transport layer, 4: Light absorption layer, 5: Hybrid particle, 6: Charge separation layer, 7: Hole transport layer, 8: First electrode, 9: Second electrode, 10: Protective layer, 11: TiN layer, 12: $CH_3NH_3PbI_3$, 13: Titanyl phthalocyanine, 15: Photoelectric conversion element, 20: Photosensitive body, 21: Charger, 22: Exposure section, 23: Developer, 24: Transfer section, 25: Cleaning section, 26: Fixing section, 27: Sheet feeding cassette, 28: Paper discharge tray, 30: Image forming apparatus

What is claimed is:

1. A hybrid particle comprising:
an inorganic core particle;
an electron transport layer covering a surface of the inorganic core particle; and
a light absorption layer covering the electron transport layer, wherein:
the inorganic core particle includes a titanium oxide particle;
the electron transport layer includes a titanium nitride layer;
the light absorption layer contains a compound having an organic-inorganic hybrid perovskite crystal structure or a metal complex; and
the compound or the metal complex is grown in a crystalline form on a surface of the electron transport layer.

2. The hybrid particle according to claim 1, wherein:
the organic-inorganic hybrid perovskite crystal structure is represented by $ABX_3$;
A represents an organic cation;
B represents a metal ion; and
X represents a halogen ion.

3. The hybrid particle according to claim 1, wherein the metal complex includes titanyl phthalocyanine.

4. The hybrid particle according to claim 1, wherein
the compound is represented by $CH_3NH_3PbX_3$; and
X represents a halogen ion.

5. A photoelectric conversion element comprising:
a first electrode;
a first charge separation layer provided on the first electrode; and
a second electrode provided on the first charge separation layer, wherein:
the first charge separation layer includes a hole transport layer, and a plurality of hybrid particles according to claim 1; and
the plurality of hybrid particles are covered by the hole transport layer.

6. A photosensitive body comprising:
an electrode; and
a charge separation layer provided on the electrode, wherein:
the charge separation layer includes a hole transport layer, and a plurality of hybrid particles according to claim 1, and
the plurality of hybrid particles are covered by the hole transport layer.

7. An image forming apparatus comprising the photosensitive body according to claim 6.

* * * * *